(12) United States Patent
Tamura et al.

(10) Patent No.: US 8,730,186 B2
(45) Date of Patent: May 20, 2014

(54) TOUCH PANEL

(75) Inventors: Hikaru Tamura, Kanagawa (JP);
Munehiro Kozuma, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 660 days.

(21) Appl. No.: 12/788,893

(22) Filed: May 27, 2010

(65) Prior Publication Data

US 2010/0300862 A1 Dec. 2, 2010

(30) Foreign Application Priority Data

May 28, 2009 (JP) .................................. 2009-128549

(51) Int. Cl.
*H03K 17/975* (2006.01)
(52) U.S. Cl.
USPC ........... 345/173; 345/174; 345/175; 345/176; 345/177; 345/178
(58) Field of Classification Search
USPC ........................ 345/173–178; 178/18–20.04
See application file for complete search history.

(56) References Cited

U.S. PATENT DOCUMENTS

| | | | |
|---|---|---|---|
| 6,223,429 B1 * | 5/2001 | Kaneda et al. ................... | 29/832 |
| 6,355,964 B1 | 3/2002 | Mueller et al. | |
| 6,465,280 B1 | 10/2002 | Martin et al. | |
| 6,749,733 B1 | 6/2004 | Sibbett | |
| 6,753,488 B2 | 6/2004 | Ono et al. | |

(Continued)

FOREIGN PATENT DOCUMENTS

| | | |
|---|---|---|
| EP | 1 134 811 A1 | 9/2001 |
| EP | 1 324 399 A2 | 7/2003 |

(Continued)

OTHER PUBLICATIONS

Kimizuka, N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System," Journal of Solid State Chemistry, vol. 116, Apr. 1, 1995, pp. 170-178.

(Continued)

*Primary Examiner* — Bipin Shalwala
*Assistant Examiner* — Paras D Karki
(74) *Attorney, Agent, or Firm* — Husch Blackwell LLP

(57) ABSTRACT

A touch sensor (touch panel) which can be formed over the same substrate as a display portion is provided. Alternatively, a touch sensor (touch panel) which does not cause degradation in the quality of an image displayed on a display portion is provided. The touch panel includes a light-emitting element and a microstructure in which a pair of electrodes facing each other is isolated with an insulating material. As the insulating material, an elastic material or a material having a hole is used so that a filler layer formed using the insulating material can be deformed when a movable portion operates. It is preferable to use a material which is softened or hardened by certain treatment (e.g., heat treatment or chemical treatment) after formation.

25 Claims, 28 Drawing Sheets

(56) References Cited

U.S. PATENT DOCUMENTS

| | | |
|---|---|---|
| 6,780,786 B2 | 8/2004 | Dougherty |
| 7,030,494 B2 | 4/2006 | Aoki |
| 7,061,014 B2 | 6/2006 | Hosono et al. |
| 7,064,346 B2 | 6/2006 | Kawasaki et al. |
| 7,122,832 B2 * | 10/2006 | Nishikawa ............ 257/59 |
| 7,123,243 B2 | 10/2006 | Kawasaki et al. |
| 7,230,198 B2 | 6/2007 | Cok et al. |
| 7,282,782 B2 | 10/2007 | Hoffman et al. |
| 7,323,356 B2 | 1/2008 | Hosono et al. |
| 7,499,038 B2 * | 3/2009 | Nishikawa et al. ........ 345/174 |
| 7,579,663 B2 | 8/2009 | Wan |
| 7,671,430 B2 | 3/2010 | Inaba et al. |
| 7,674,650 B2 | 3/2010 | Akimoto et al. |
| 7,687,297 B2 | 3/2010 | Heck et al. |
| 7,687,833 B2 | 3/2010 | Marty et al. |
| 7,825,911 B2 | 11/2010 | Sano et al. |
| 8,120,587 B2 * | 2/2012 | Kim et al. ............ 345/173 |
| 8,203,539 B2 * | 6/2012 | Kim et al. ............ 345/174 |
| 8,237,877 B2 * | 8/2012 | Lee et al. ............ 349/12 |
| 2002/0171114 A1 | 11/2002 | Ishio et al. |
| 2003/0151879 A1 | 8/2003 | Yang et al. |
| 2003/0173568 A1 | 9/2003 | Asakawa et al. |
| 2004/0245588 A1 | 12/2004 | Nikkel et al. |
| 2005/0112886 A1 | 5/2005 | Asakawa et al. |
| 2005/0275343 A1 | 12/2005 | Tanaka et al. |
| 2006/0244107 A1 | 11/2006 | Sugihara et al. |
| 2006/0270238 A1 | 11/2006 | Izumi et al. |
| 2007/0108446 A1 | 5/2007 | Akimoto |
| 2007/0194379 A1 | 8/2007 | Hosono et al. |
| 2007/0222762 A1 * | 9/2007 | Van Delden et al. ........ 345/173 |
| 2008/0128841 A1 | 6/2008 | Fujimori et al. |
| 2009/0108381 A1 | 4/2009 | Buchwalter et al. |
| 2009/0117364 A1 | 5/2009 | Tsuchiya et al. |
| 2009/0121982 A1 * | 5/2009 | Choi et al. ............ 345/76 |
| 2009/0212288 A1 * | 8/2009 | Kim et al. ............ 257/57 |
| 2009/0230392 A1 * | 9/2009 | Takahara ............ 257/43 |
| 2010/0134426 A1 * | 6/2010 | Lee et al. ............ 345/173 |
| 2010/0148284 A1 | 6/2010 | Watanabe et al. |
| 2010/0177054 A1 * | 7/2010 | Iida et al. ............ 345/173 |
| 2010/0182282 A1 | 7/2010 | Kurokawa et al. |
| 2011/0187669 A1 | 8/2011 | Abiru et al. |

FOREIGN PATENT DOCUMENTS

| | | |
|---|---|---|
| EP | 1 359 499 A2 | 11/2003 |
| JP | 5-251705 | 9/1993 |
| JP | 2000-44236 | 2/2000 |
| JP | 2000-150900 | 5/2000 |
| JP | 2000-273236 | 10/2000 |
| JP | 2000-331557 | 11/2000 |
| JP | 2002-76356 | 3/2002 |
| JP | 2002-289859 | 10/2002 |
| JP | 2003-258296 | 9/2003 |
| JP | 2003-296022 | 10/2003 |
| JP | 2005-33172 | 2/2005 |
| JP | 2005-332589 | 12/2005 |
| JP | 2007-1004 | 1/2007 |
| JP | 2007-58071 | 3/2007 |
| JP | 2007-264852 | 10/2007 |
| JP | 2008-520083 | 6/2008 |
| WO | WO 03/040441 A1 | 5/2003 |
| WO | WO 2006/055312 A1 | 5/2006 |
| WO | WO 2010/055596 A1 | 5/2010 |

OTHER PUBLICATIONS

Li, C. et al., "Modulated Structures of Homologous Compounds $InMO_3(ZnO)_m$ (M=In, Ga; m=Integer) Described by Four-Dimensional Superspace Group," Journal of Solid State Chemistry, vol. 139, 1998, pp. 347-355.

Nomura, K. et al., "Thin-Film Transistor Fabricated in Single-Crystalline Transparent Oxide Semiconductor," Science, vol. 300, No. 5623, May 23, 2003, pp. 1269-1272.

Nomura et al., "31a-ZA-6 Carrier Transport in Transparent Amorphous Oxide Semiconductor $InGaZnO_4$," Extended Abstracts (The 51st Spring Meeting 2004), The Japan Society of Applied Physics and Related Societies, No. 2, Mar. 28, 2004, pp. 669 (with English translation).

Kamiya et al., "1a-F-5 Room Temperature Fabrication and Carrier Transport of Amorphous Semiconductor Exhibiting Large Electron Hall Mobilities > 10 $cm^2$/Vs," Extended Abstracts (The 65th Autumn Meeting 2004), The Japan Society of Applied Physics, No. 2, Sep. 1, 2004, pp. 791 (with English translation).

Nomura, K. et al., "Carrier Transport in Transparent Oxide Semiconductor with Intrinsic Structural Randomness Probed using Single-Crystalline $InGaO_3(ZnO)_5$ Films," Applied Physics Letters, vol. 85, No. 11, Sep. 13, 2004, pp. 1993-1995.

Nomura, K. et al, "Room-Temperature Fabrication of Transparent Flexible Thin-Film Transistors Using Amorphous Oxide Semiconductors," NATURE, vol. 432, Nov. 25, 2004, pp. 488-492.

* cited by examiner

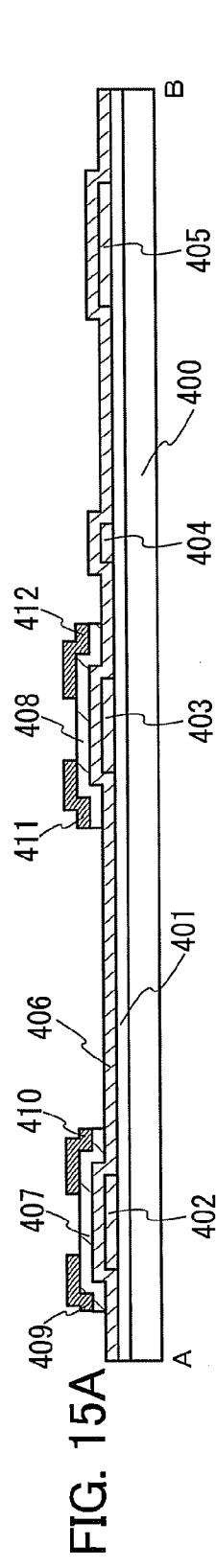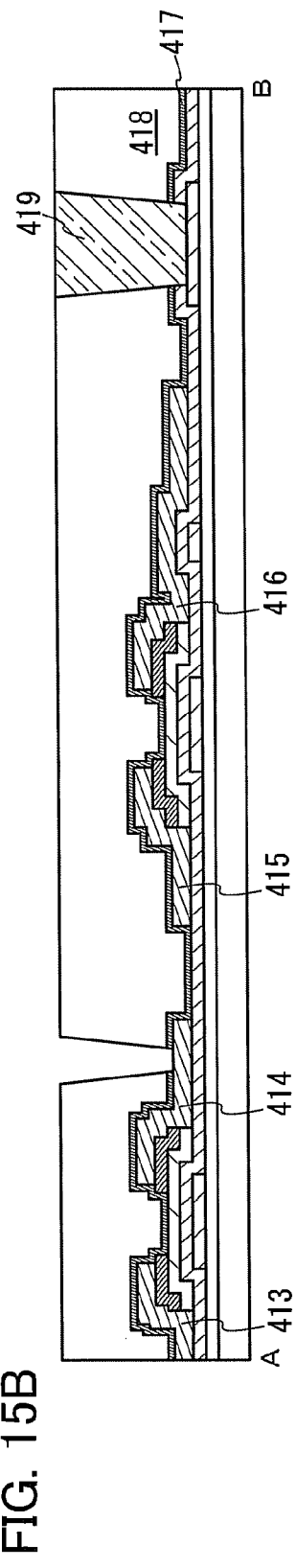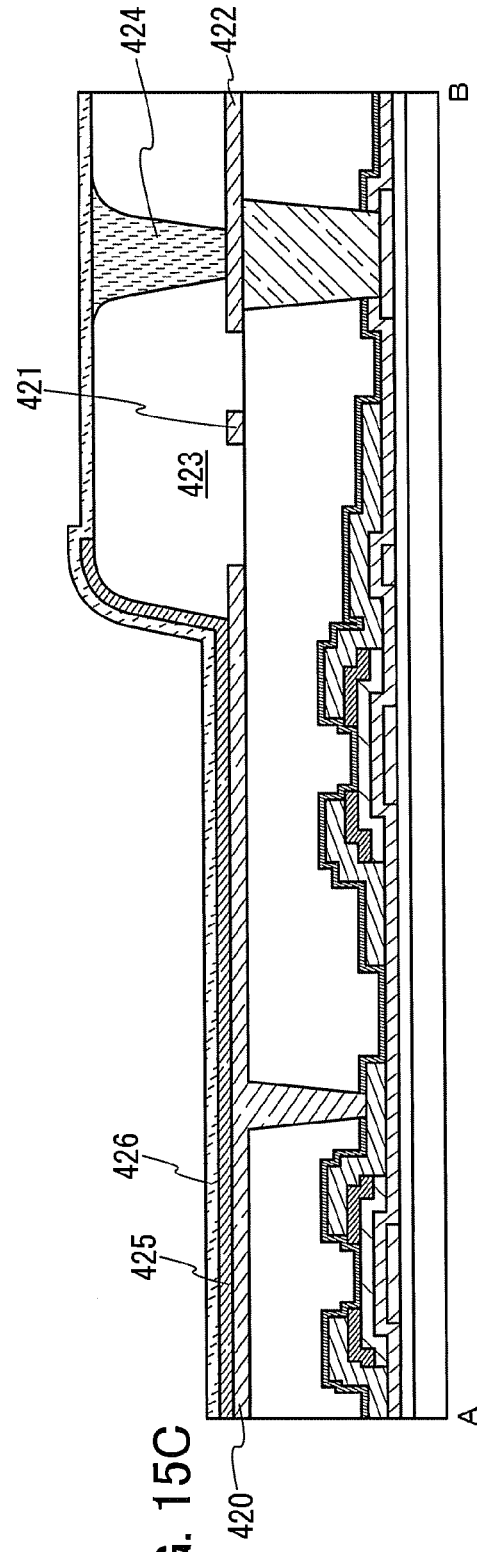

FIG. 18
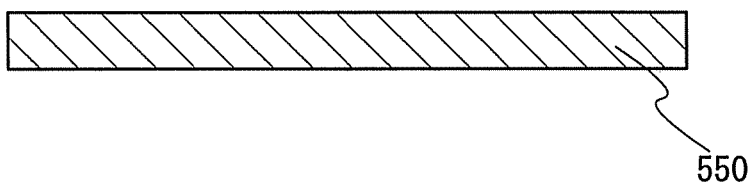
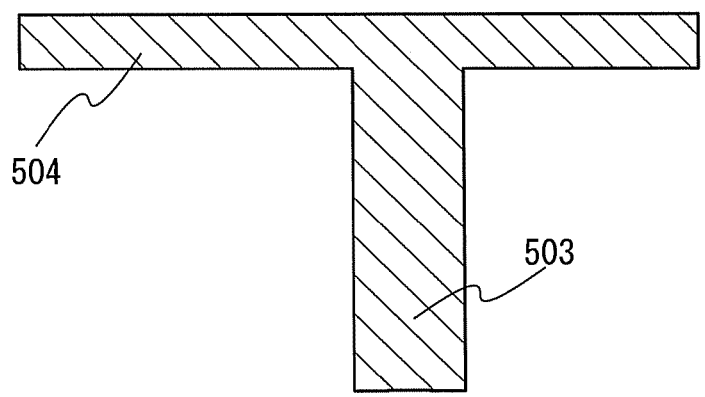
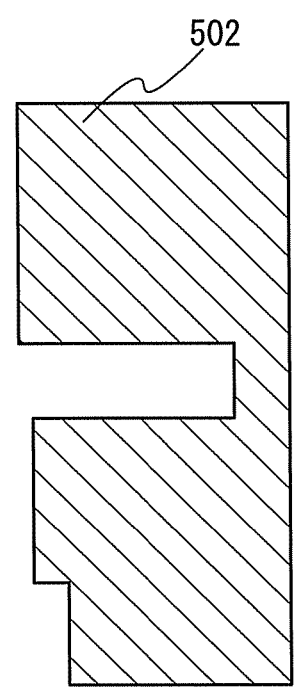

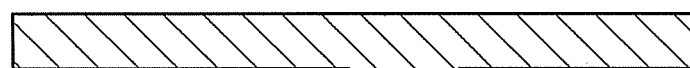
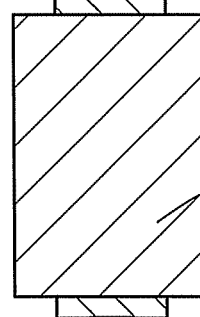
507
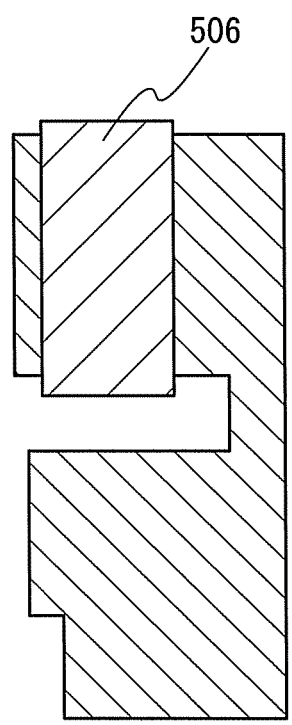
506

TOUCH PANEL

BACKGROUND OF THE INVENTION

1. Field of the Invention

The present invention relates to touch panels including touch sensors and display portions.

2. Description of the Related Art

In recent years, display devices including touch sensors have attracted attention. The display devices including touch sensors are referred to as touch panels, touch screens, or the like (hereinafter simply referred to as touch panels). Examples of the types of touch sensors include a resistive type, an acoustic pulse recognition type, a surface acoustic wave type, an infrared light-blocking type, a capacitive type, an electromagnetic induction type, an image recognition type, and the like. These types have different operating principles. In any type of touch sensor, data can be input when an object to be detected is in contact with a display device.

A conventional touch sensor is formed over or below an EL layer including a light-emitting layer. In the case where a touch sensor is formed over an EL layer as in Reference 1, it is necessary to provide a protective film or a protective substrate over a display surface. Thus, even if any high-definition display device is manufactured, visibility decreases and image quality degrades. In contrast, in the case where a touch sensor is formed below an EL layer as in Reference 2, an image can be displayed at high definition; however, it is difficult to apply pressure to the touch sensor. Thus, the touch sensor has a problem of the decrease in accuracy.

REFERENCE

Reference 1: Japanese Published Patent Application No. 2000-331557

Reference 2: Japanese Published Patent Application No. 2003-296022

SUMMARY OF THE INVENTION

It is an object of one embodiment of the present invention to provide a touch sensor which can be formed over the same substrate as a display portion. Alternatively, it is an object of one embodiment of the present invention to provide a touch sensor which does not cause degradation in the quality of an image displayed on a display portion.

In one embodiment of the present invention, a touch panel includes a microstructure, a thin film transistor, a light-emitting element which is electrically connected to the thin film transistor, and a spacer. The microstructure includes a lower electrode, an upper electrode which faces the lower electrode and can move in a direction to the lower electrode by application of pressure, and a filler layer which is provided between the lower electrode and the upper electrode. The lower electrode is formed using the same material as a gate electrode of the thin film transistor. The upper electrode is formed using the same material as a first electrode of the light-emitting element. The filler layer is formed using a porous insulating material which can be reversibly deformed by the pressure. The spacer is formed over the upper electrode with the use of a material which is harder than the material of a partition wall for covering the first electrode of the light-emitting element. The partition wall is formed using a material which is harder than the material of the filler layer.

In one embodiment of the present invention, a touch panel includes a microstructure, a thin film transistor, a light-emitting element which is electrically connected to the thin film transistor, and a spacer. The microstructure includes a lower electrode, an upper electrode which faces the lower electrode and can move in a direction to the lower electrode by application of pressure, and a filler layer which is provided between the lower electrode and the upper electrode. The lower electrode is formed using the same material as a source electrode or a drain electrode of the thin film transistor. The upper electrode is formed using the same material as a first electrode of the light-emitting element. The filler layer is formed using a porous insulating material which can be reversibly deformed by the pressure. The spacer is formed over the upper electrode with the use of a material which is harder than the material of a partition wall for covering the first electrode of the light-emitting element. The partition wall is formed using a material which is harder than the material of the filler layer.

The porosity of the filler layer is preferably higher than or equal to 20% and lower than or equal to 80%.

The porous insulating material is preferably formed using a block copolymer.

In one embodiment of the present invention, a touch panel includes a microstructure, a thin film transistor, a light-emitting element which is electrically connected to the thin film transistor, and a spacer. The microstructure includes a lower electrode, an upper electrode which faces the lower electrode and can move in a direction to the lower electrode by application of pressure, and a filler layer which is provided between the lower electrode and the upper electrode. The lower electrode is formed using the same material as a gate electrode of the thin film transistor. The upper electrode is formed using the same material as a first electrode of the light-emitting element. The filler layer is formed using an elastic insulating material which can be reversibly deformed by the pressure. The spacer is formed over the upper electrode with the use of a material which is harder than the material of a partition wall for covering the first electrode of the light-emitting element. The partition wall is formed using a material which is harder than the material of the filler layer.

In one embodiment of the present invention, a touch panel includes a microstructure, a thin film transistor, a light-emitting element which is electrically connected to the thin film transistor, and a spacer. The microstructure includes a lower electrode, an upper electrode which faces the lower electrode and can move in a direction to the lower electrode by application of pressure, and a filler layer which is provided between the lower electrode and the upper electrode. The lower electrode is formed using the same material as a source electrode or a drain electrode of the thin film transistor. The upper electrode is formed using the same material as a first electrode of the light-emitting element. The filler layer is formed using an elastic insulating material which can be reversibly deformed by the pressure. The spacer is formed over the upper electrode with the use of a material which is harder than the material of a partition wall for covering the first electrode of the light-emitting element. The partition wall is formed using a material which is harder than the material of the filler layer.

The elastic insulating material is preferably formed using an elastomer or a thermoplastic elastomer.

In one embodiment of the present invention, a touch sensor and a light-emitting element are disposed, so that it is possible to provide a thin touch panel with little degradation in image quality.

In one embodiment of the present invention, by using materials having different hardness for a filler layer, a partition wall, and a spacer, it is possible to provide a touch panel where data can be input efficiently and pressure is not applied to a light-emitting element easily. Further, by providing a spacer above a touch sensor, durability and sensitivity of the touch sensor can be improved.

BRIEF DESCRIPTION OF THE DRAWINGS

In the accompanying drawings:

FIGS. 15A to 15C are cross-sectional views according to one embodiment of the present invention;

FIG. 18 is a top view according to one embodiment of the present invention;

DETAILED DESCRIPTION OF THE INVENTION

Figure 1A:
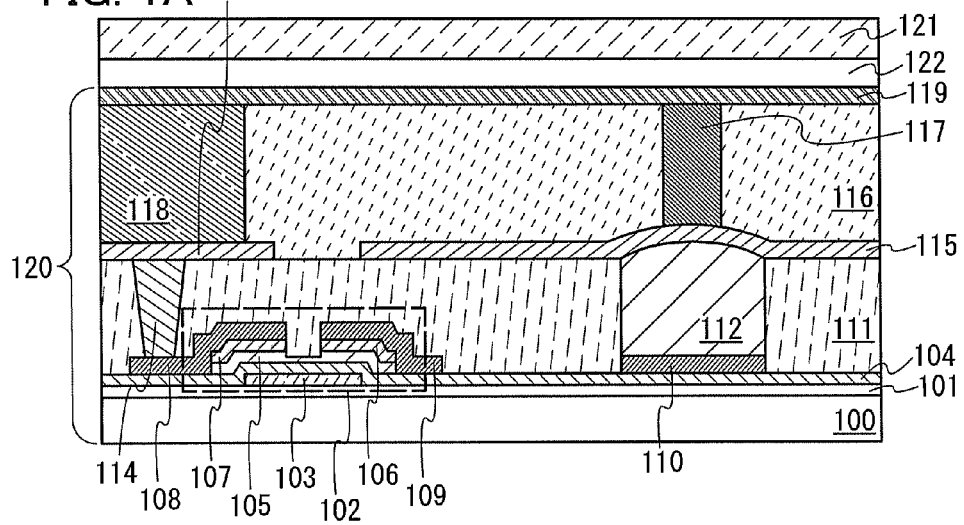
FIGS. 1A and 1B are cross-sectional views according to one embodiment of the present invention.

Hereinafter, embodiments of the present invention will be described in detail with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments. Note that in the following structures of one embodiment of the present invention, the same portions or portions having similar functions are denoted by common reference numerals in different drawings, and description thereof is not repeated.

(Embodiment 1)

In this embodiment, structures of a touch panel of one embodiment of the present invention are described with reference to FIGS. 1A and 1B and FIG. 2.

A touch sensor is a device to which data is input when an upper electrode and a lower electrode are in contact with each other or the distance between the upper electrode and the lower electrode is changed, for example. In one embodiment of the present invention, a microelectromechanical system (MEMS) is used for the touch sensor.

MEMS is the abbreviation of a microelectromechanical system and is also simply called a micromachine. A micromachine generally refers to a micro device where "an electronic circuit having a semiconductor element" and "a movable microstructure having a three-dimensional structure" formed using a semiconductor microfabrication technology are integrated. Unlike the semiconductor element, the microstructure generally includes a movable portion.

The microstructure includes a structural layer and a hollow portion, and the structural layer includes a movable portion. Since the movable portion of the structural layer operates, sufficient mechanical strength is needed for the microstructure. A conventional microstructure includes a hollow portion in order to secure an operation region of a movable portion. The hollow portion is formed in such a manner that a sacrificial layer is formed in a portion which is to be the hollow portion and is removed by etching or the like after a structural layer or the like is formed. For example, in the case of a microstructure in which a movable portion of a structural layer operates in a direction perpendicular to a substrate surface, a lower part of the microstructure is formed, a sacrificial layer is formed over the lower part of the microstructure, an upper part of the microstructure is formed over the sacrificial layer, and the sacrificial layer is removed by etching or the like. In this manner, a microstructure including a hollow portion is formed.

However, when a hollow portion is formed using a sacrificial layer as described above, there is a problem in that a microstructure is easily damaged or broken due to strong contact between an upper electrode and a lower electrode of the microstructure in a manufacturing process, for example. Further, there is a problem in that normal operation cannot be performed due to sticking between an upper electrode and a lower electrode. Here, sticking refers to a phenomenon in which, due to the operation of a movable portion of a microstructure, an upper electrode and a lower electrode are in strong contact with each other such that the upper electrode and the lower electrode cannot separate from each other.

Further, when a hollow portion is formed using a sacrificial layer, there is a problem in that the sacrificial layer is not completely etched and an etching residue is generated. Alternatively, because of the operation of an upper portion of a formed microstructure, the microstructure might be damaged or broken. This is particularly remarkable when the height of the hollow portion is high or the toughness of a structural layer is not enough. Furthermore, when a hollow portion is provided, there is a problem in that a structure including the hollow portion is deformed by, for example, warpage and that a desired structure cannot be obtained.

Thus, a microstructure (MEMS) used in one embodiment of the present invention has a structure where a pair of electrodes facing each other is isolated with a space, a movable structure is provided with at least one of the electrodes, and the space is filled with an insulating material. As the insulating material, a material having a hole is used so that a filler material layer formed using the insulating material can be deformed when a movable portion operates. It is preferable to use a material which is softened or hardened by certain treatment (e.g., heat treatment or chemical treatment) after formation.

Figure 1B:
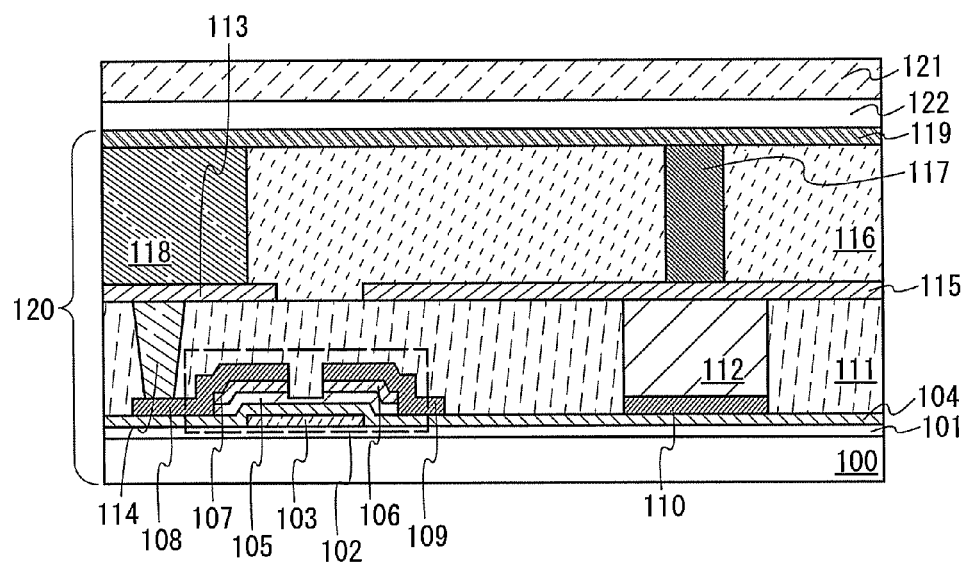

FIGS. 1A and 1B are cross-sectional views schematically illustrating a touch panel of one embodiment of the present invention.

A base film 101 and a thin film transistor 102 are formed over a substrate 100. The thin film transistor 102 includes, for example, a gate electrode 103, a gate insulating film 104, a first semiconductor layer 105, second semiconductor layers (a semiconductor layer 106 and a semiconductor layer 107), a conductive layer 108, and a conductive layer 109. In FIGS. 1A and 1B, a lower electrode 110 of a touch sensor is formed using the same material as the conductive layer 108 and the conductive layer 109. The lower electrode 110 may be formed using any one of materials used for the thin film transistor 102. However, the material used for the lower electrode 110 is not limited to the above material.

An insulating layer 111 is formed so as to cover the thin film transistor 102. A filler layer 112 is formed over the lower electrode 110 of the touch sensor. A wiring 114 which electrically connects a first electrode 113 of an EL element and the conductive layer 108 to each other is formed. An upper electrode 115 of the touch sensor is formed using the same material as the first electrode 113. Note that a deformable porous material or an elastic insulating material can be used for the filler layer 112. Further, the first electrode 113 and the wiring 114 can be formed concurrently using the same material.

As illustrated in FIG. 1A, the filler layer 112 may have a swollen upper portion. Alternatively, as illustrated in FIG. 1B, the filler layer 112 may have a flat upper portion.

In addition, a partition wall 116 which covers an end portion of the first electrode 113 and the upper electrode 115 and has an opening reaching the upper electrode 115 is formed. A spacer 117 is formed in the opening. The spacer 117 is provided so as to overlap with the lower electrode 110 and the filler layer 112 with the upper electrode 115 therebetween. An EL layer 118 is formed in contact with the first electrode 113. A second electrode 119 is formed over the EL layer 118 and the partition wall 116.

Here, among the materials used for the filler layer 112, the partition wall 116, and the spacer 117, the material used for the spacer 117 is the hardest material and the material used for the filler layer 112 is the softest material. Elastic modulus or the like indicates hardness or softness. The elastic modulus is a physical value indicating an object's tendency to be deformed elastically. In the case where hardness or softness is indicated by elastic modulus, the elastic modulus of the material used for the spacer 117 is higher than the elastic modulus of the material used for the partition wall 116, and the elastic modulus of the material used for the partition wall 116 is higher than the elastic modulus of the material used for the filler layer 112.

Then, sealing is performed. For example, sealing is performed in such a manner that a sealant (not illustrated) is provided at an end portion of an element substrate 120 including the thin film transistor 102 and the like and the element substrate 120 and a sealing substrate 121 are attached to each other with the sealant. The touch panel illustrated in FIGS. 1A and 1B has a structure where a light-emitting element faces a space 122 surrounded by the element substrate 120, the sealing substrate 121, and the sealant. The space 122 is filled with an inert gas (e.g., nitrogen or argon). The space 122 may be filled with a sealant as a substitute for the inert gas.

Figure 2:
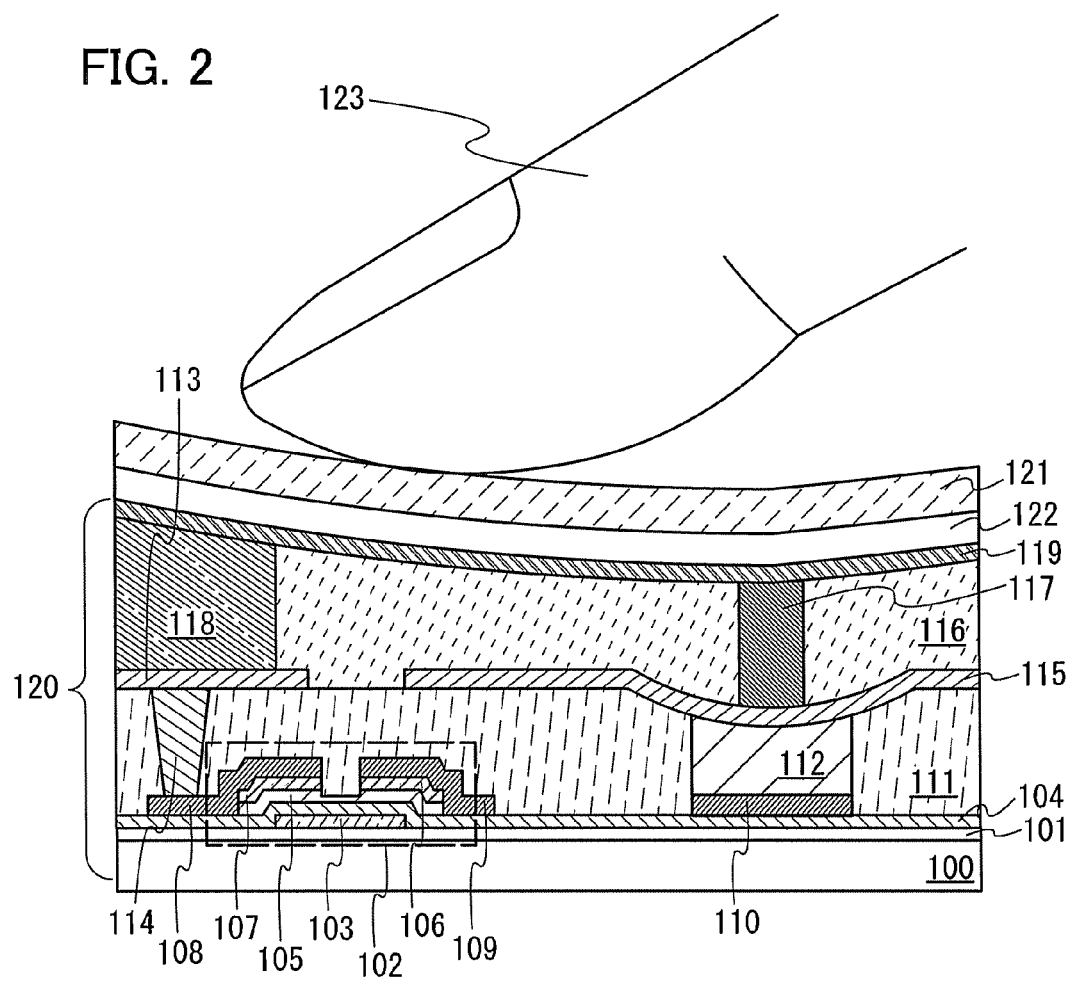
FIG. 2 is a cross-sectional view according to one embodiment of the present invention.

Next, FIG. 2 illustrates the case where the touch panel is touched with a finger.

As illustrated in FIG. 2, when a surface of the sealing substrate 121 is touched with a finger 123, the sealing substrate 121 bends. In this case, an upper portion of the partition wall 116 is pressed and dented, and the spacer 117 which is harder (which has higher elastic modulus) than the material used for the partition wall 116 is pressed down. Since the filler layer 112 provided below the spacer 117 is softer (has lower elastic modulus) than the spacer 117, the spacer 117 is pressed down without deformation. Since the upper electrode 115 of the touch sensor is pressed down when the spacer 117 is pressed down, the lower electrode 110 and the upper electrode 115 of the touch sensor are in contact with each other or the distance between the lower electrode 110 and the upper electrode 115 is changed. Thus, data can be input.

According to one embodiment of the present invention, a touch sensor and a light-emitting element are disposed, so that it is possible to provide a thin touch panel with less degradation in image quality as compared to the case where a touch sensor is provided above or below a light-emitting element.

According to one embodiment of the present invention, by using materials having different hardness for a filler layer, a partition wall, and a spacer, it is possible to provide a touch panel where data can be input efficiently and pressure is not applied to a light-emitting element easily. Further, by providing a spacer above a touch sensor, durability and sensitivity of the touch sensor can be improved.

Note that this embodiment can be combined with the structure described in any of the other embodiments in this specification as appropriate.

(Embodiment 2)

In this embodiment, the operation of a capacitive type touch panel is described.

In a capacitive type touch sensor, data is input when the distance between an upper electrode and a lower electrode is changed. In one embodiment of the present invention, a microstructure (MEMS) is used for the touch sensor.

Since the structure of the touch sensor is as illustrated in FIGS. 1A and 1B and FIG. 2, description thereof is omitted here.

In the capacitive type touch panel, an insulating material which is a dielectric is provided between an upper electrode and a lower electrode. A deformable porous material or an elastic insulating material is used for the filler layer 112, which is the dielectric.

Figure 3A:
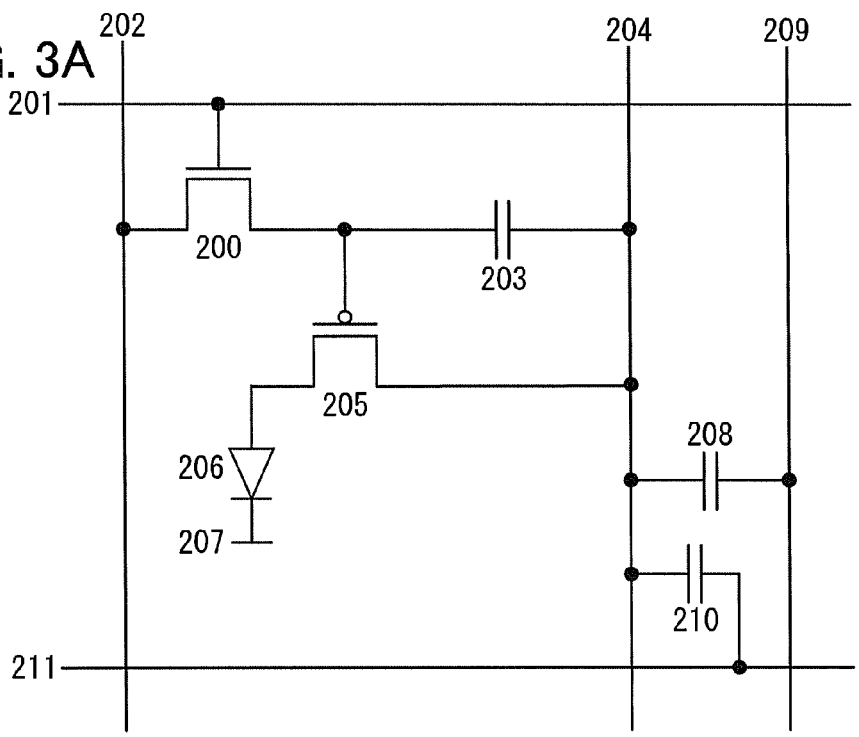
FIGS. 3A and 3B are circuit diagrams according to one embodiment of the present invention.
Figure 12:
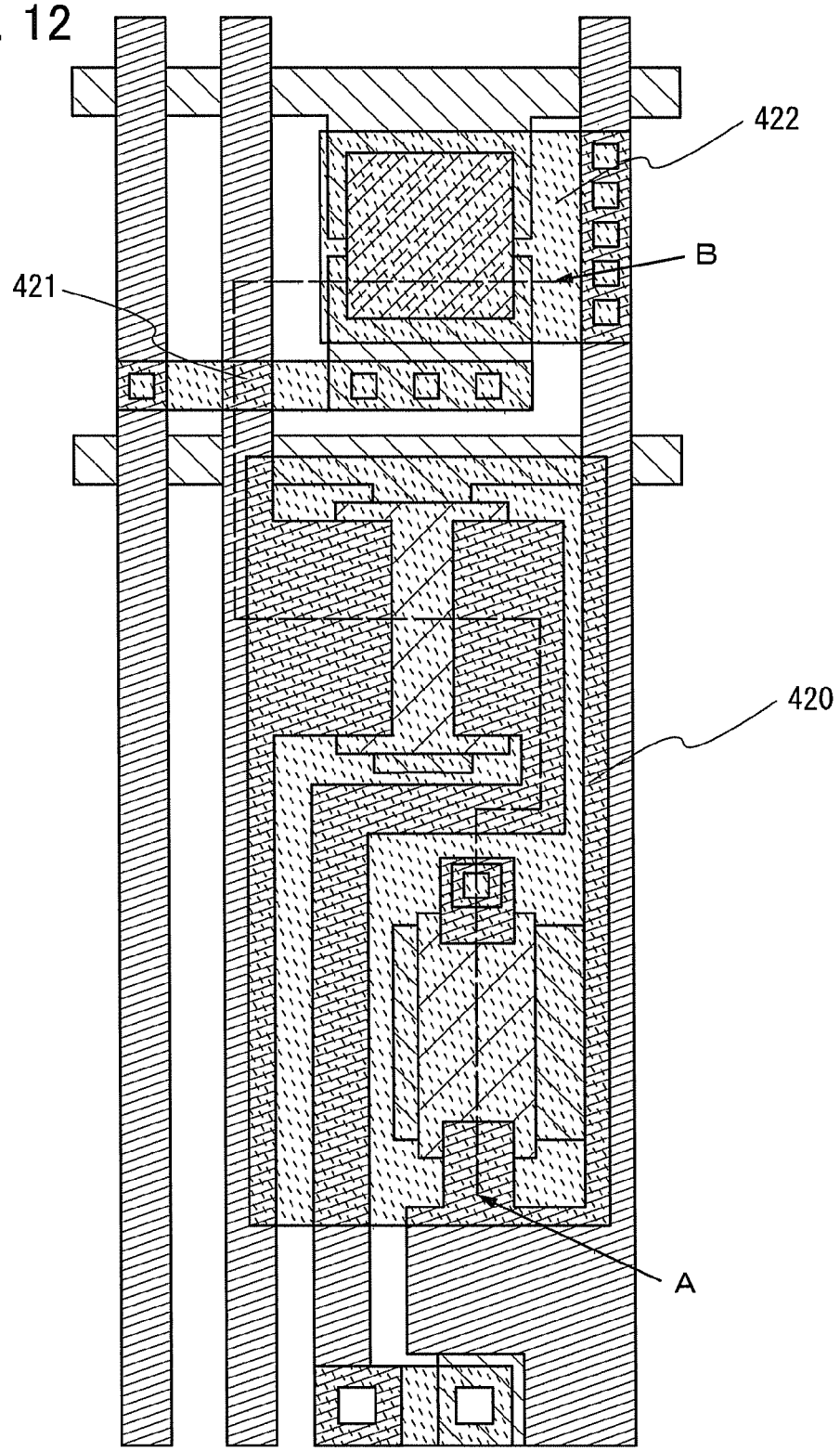
FIG. 12 is a top view according to one embodiment of the present invention.
Figure 22:
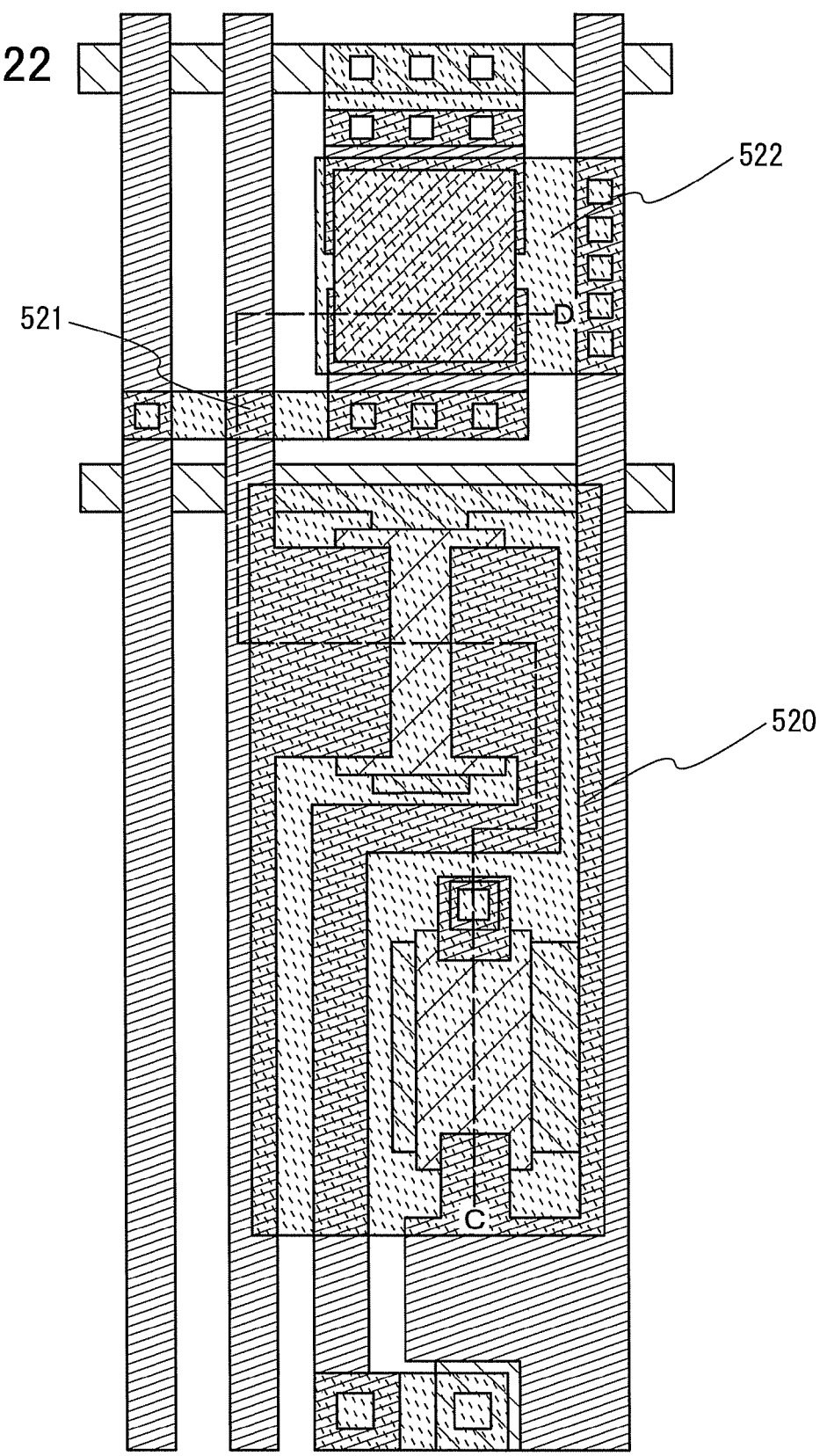
FIG. 22 is a top view according to one embodiment of the present invention.

FIG. 3A illustrates one embodiment of one pixel included in the capacitive type touch panel. A top view of FIG. 3A is illustrated in FIG. 12 or FIG. 22, for example.

A gate of a switching transistor 200 is electrically connected to a gate line 201. One of a source and a drain of the switching transistor 200 is electrically connected to a source line 202. A first terminal of a first capacitor 203 is electrically connected to the other of the source and the drain of the switching transistor 200. A second terminal of the first capacitor 203 is electrically connected to a power supply line 204. A gate of a driving transistor 205 is electrically connected to the other of the source and the drain of the switching transistor

200. One of a source and a drain of the driving transistor 205 is electrically connected to one of electrodes of a light-emitting element 206. The other of the electrodes of the light-emitting element 206 is electrically connected to a power supply line 207. The other of the source and the drain of the driving transistor 205 is electrically connected to the power supply line 204. A first terminal of a second capacitor 208 is electrically connected to the power supply line 204. A second terminal of the second capacitor 208 is electrically connected to a column line 209. A first terminal of a third capacitor 210 is electrically connected to the power supply line 204. A second terminal of the third capacitor 210 is electrically connected to a row line 211. Note that each of the second capacitor 208 and the third capacitor 210 is a capacitor whose capacitance value is changed when the touch panel is touched with a finger or the like. Although a p-channel transistor is illustrated as the driving transistor 205 here, an n-channel transistor may be used.

Figure 4:
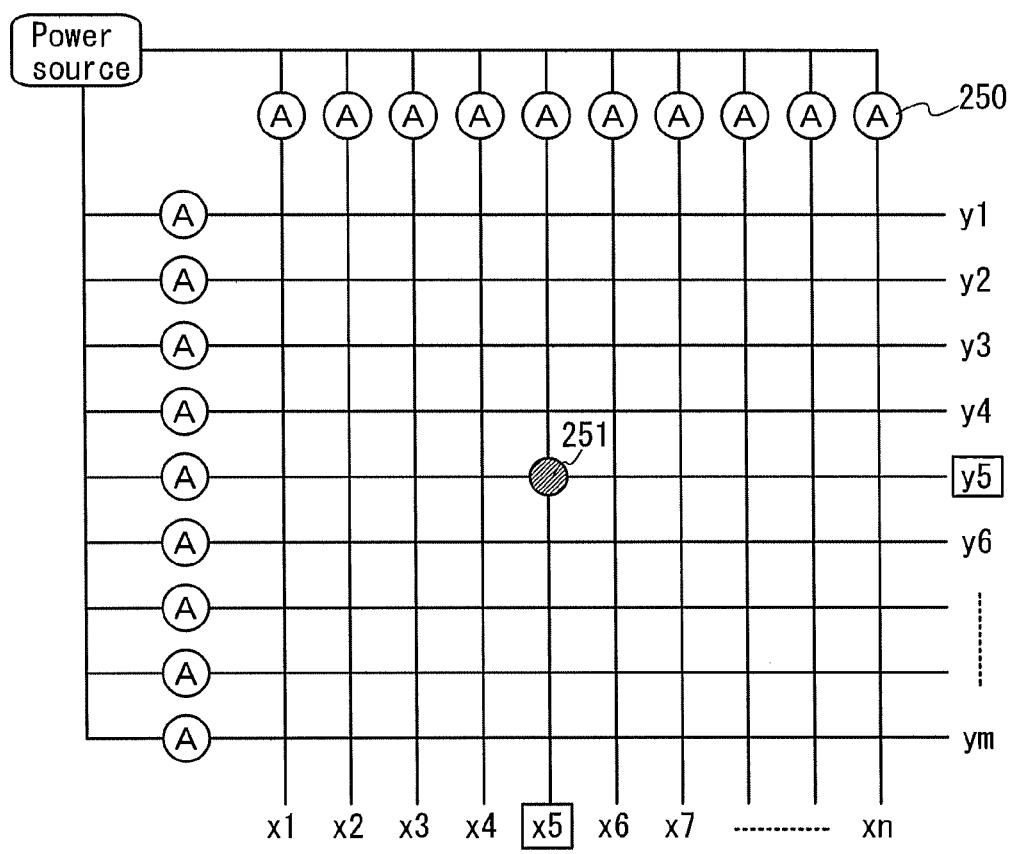
FIG. 4 is a diagram illustrating a position detection method according to one embodiment of the present invention.

FIG. 4 illustrates column lines (lines for detecting x coordinates) and row lines (lines for detecting y coordinates) for detecting a position where the touch panel is touched with a finger or the like. The column line 209 is any one of x1 to xn (n is an integer of 1 or more) illustrated in FIG. 4. The row line 211 is any one of y1 to ym (m is an integer of 1 or more) illustrated in FIG. 4.

The touch sensor includes an upper electrode, a dielectric (a filler layer in one embodiment of the present invention), and a lower electrode. The capacitance value of the touch sensor is determined by the dielectric constant of a material used for the filler layer, the area of the upper electrode or the lower electrode, and the distance between the upper electrode and the lower electrode. When the distance between the upper electrode and the lower electrode is decreased, the capacitance value is increased. When the distance between the upper electrode and the lower electrode is increased, the capacitance value is decreased.

Further, the amount of electric charges accumulated in the touch sensor is obtained by multiplying the capacitance value by the voltage between the upper electrode and the lower electrode. Since the voltage between the upper electrode and the lower electrode is not changed, the amount of the electric charges accumulated in the touch sensor is changed when the capacitance value is changed by change in the distance between the upper electrode and the lower electrode. Since current flows through the column line 209 and the row line 211 when the amount of the electric charges is changed, a touch position 251 can be detected by provision of a detector (detection circuit) 250 in a position through which current flows.

In the capacitive type touch panel, data is input when the distance between the upper electrode and the lower electrode is changed. Thus, data can be input with light touch.

Note that this embodiment can be combined with the structure described in any of the other embodiments in this specification as appropriate.

(Embodiment 3)

In this embodiment, the operation of a capacitive type touch panel which is different from that in Embodiment 2 is described.

Figure 3B:
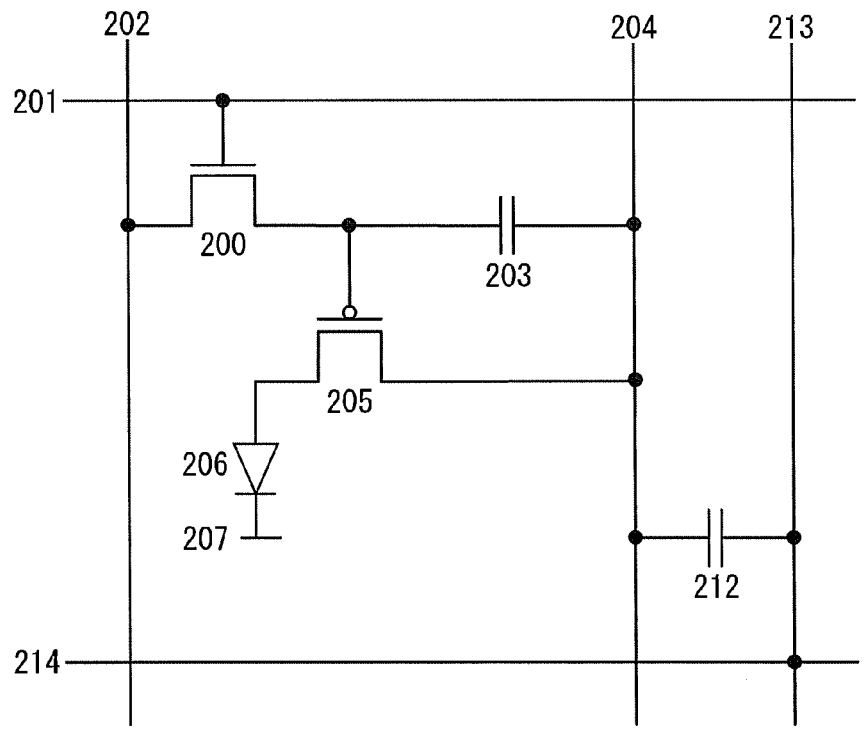
Figure 13:
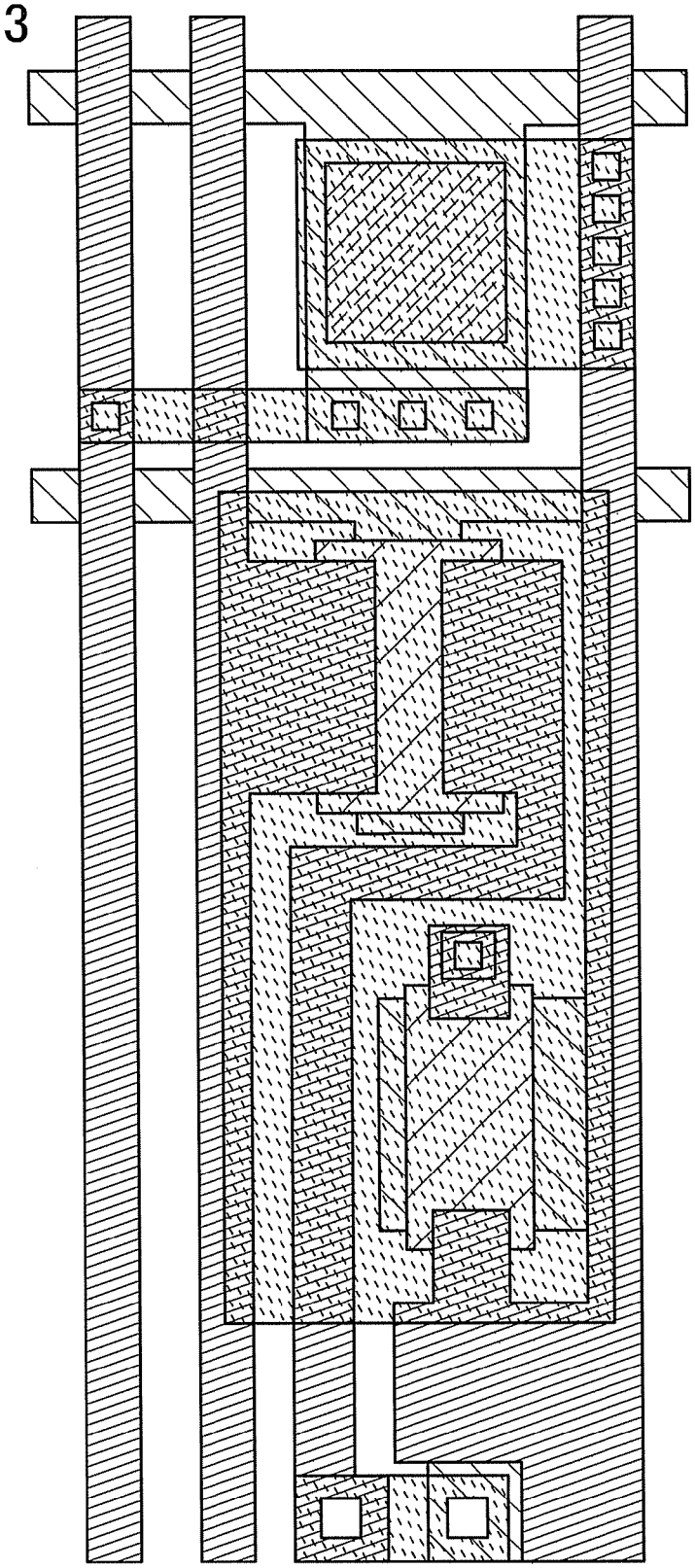
FIG. 13 is a top view according to one embodiment of the present invention.
Figure 23:
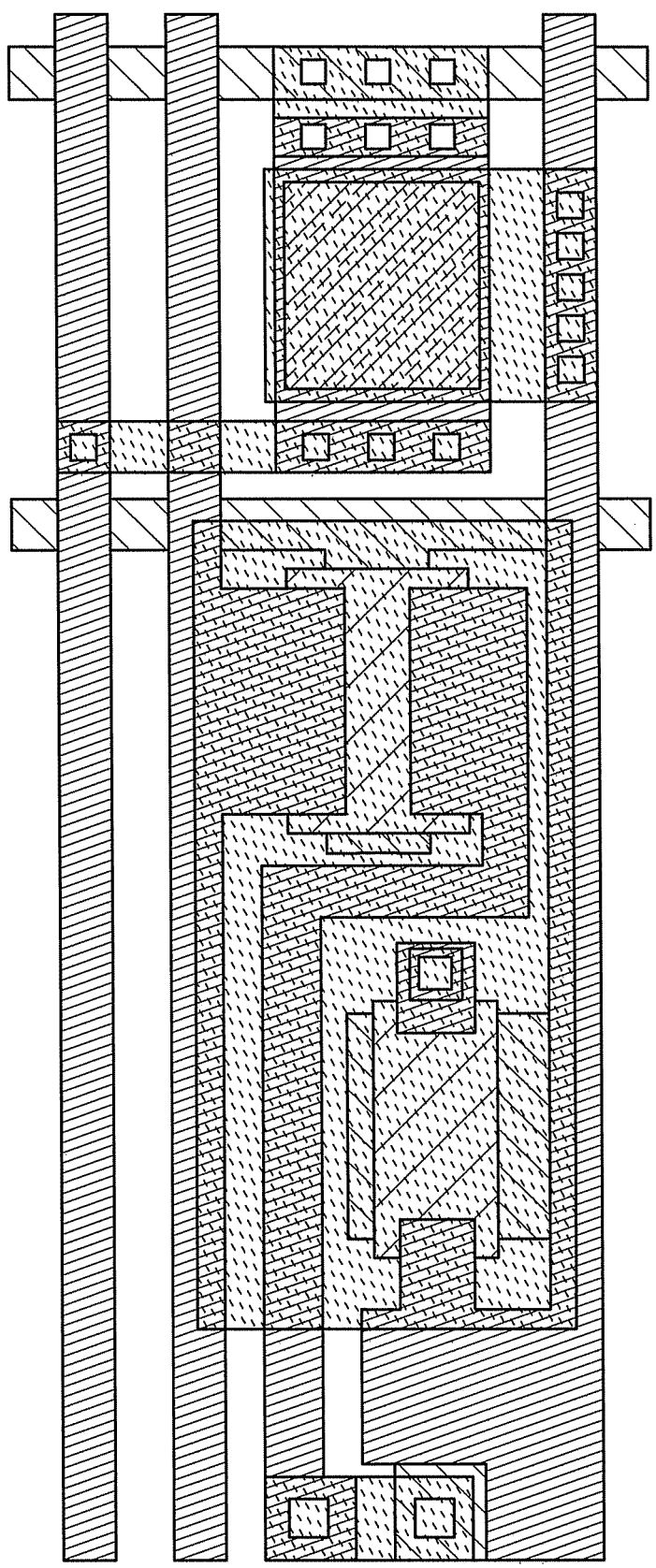
FIG. 23 is a top view according to one embodiment of the present invention.

FIG. 3B illustrates one embodiment of one pixel included in the capacitive type touch panel. A top view of FIG. 3B is illustrated in FIG. 13 or FIG. 23, for example.

The switching transistor 200, the gate line 201, the source line 202, the first capacitor 203, the power supply line 204, the driving transistor 205, the light-emitting element 206, and the power supply line 207 are similar to those in FIG. 3A. A first terminal of a second capacitor 212 is electrically connected to the power supply line 204. A second terminal of the second capacitor 212 is electrically connected to a column line 213. The column line 213 is electrically connected to a row line 214.

Although two capacitors (touch sensors) whose capacitance values are changed are provided in FIG. 3A, one capacitor (touch sensor) whose capacitance value is changed is provided in FIG. 3B. A column line (a line for detecting an x coordinate) and a row line (a line for detecting a y coordinate) for detecting a position where the touch panel is touched with a finger or the like are electrically connected to each other. Therefore, although the touch position is detected by the x coordinate and the y coordinate individually in the structure of FIG. 3A, the x coordinate and the y coordinate are detected with one touch sensor in the structure of FIG. 3B.

In the capacitive type touch panel, data is input when the distance between the upper electrode and the lower electrode is changed. Thus, data can be input with light touch.

Note that this embodiment can be combined with the structure described in any of the other embodiments in this specification as appropriate.

(Embodiment 4)

In this embodiment, the operation of a resistive type touch panel is described.

In a resistive type touch sensor, data is input when an upper electrode and a lower electrode are in contact with each other. In one embodiment of the present invention, a microstructure (MEMS) is used for the touch sensor.

Since the structure of the touch sensor is as illustrated in FIGS. 1A and 1B and FIG. 2, description thereof is omitted here.

In the resistive type touch panel, an insulating material is provided between an upper electrode and a lower electrode. A deformable porous material or an elastic insulating material is preferably used for the filler layer 112.

Figure 5A:
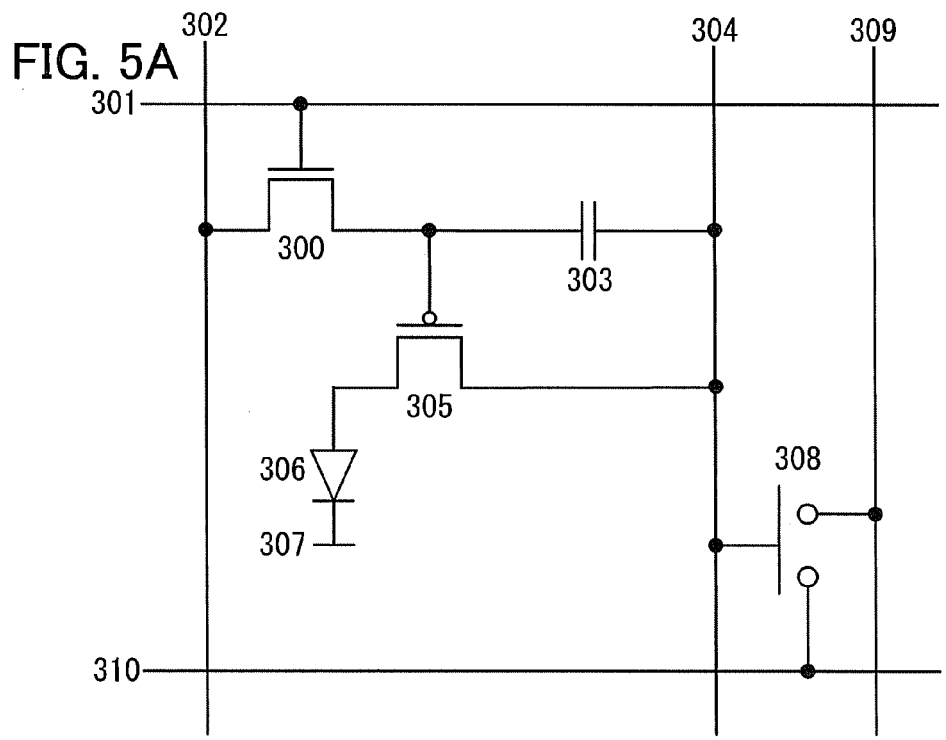
FIGS. 5A and 5B are circuit diagrams according to one embodiment of the present invention.

FIG. 5A illustrates one embodiment of one pixel included in the resistive type touch panel. A top view of FIG. 5A is illustrated in FIG. 12 or FIG. 22, for example.

A gate of a switching transistor 300 is electrically connected to a gate line 301. One of a source and a drain of the switching transistor 300 is electrically connected to a source line 302. A first terminal of a capacitor 303 is electrically connected to the other of the source and the drain of the switching transistor 300. A second terminal of the capacitor 303 is electrically connected to a power supply line 304. A gate of a driving transistor 305 is electrically connected to the other of the source and the drain of the switching transistor 300. One of a source and a drain of the driving transistor 305 is electrically connected to one of electrodes of a light-emitting element 306. The other of the electrodes of the light-emitting element 306 is electrically connected to a power supply line 307. The other of the source and the drain of the driving transistor 305 is electrically connected to the power supply line 304. A first terminal of a switch 308 is electrically connected to the power supply line 304. A second terminal of the switch 308 is electrically connected to a column line 309. A third terminal of the switch 308 is electrically connected to a row line 310. Although a p-channel transistor is illustrated as the driving transistor 305 here, an n-channel transistor may be used.

Figure 6:
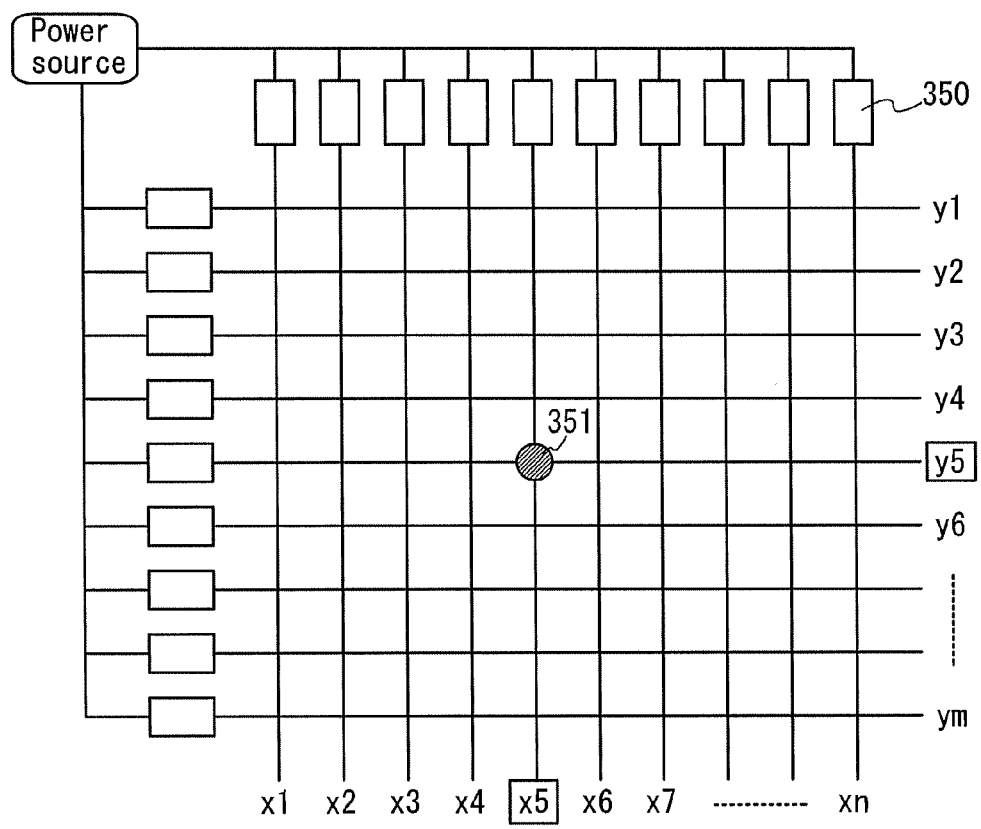
FIG. 6 is a diagram illustrating a position detection method according to one embodiment of the present invention.

FIG. 6 illustrates column lines (lines for detecting x coordinates) and row lines (lines for detecting y coordinates) for detecting a position (a touch position 351) where the touch panel is touched with a finger or the like.

When the touch panel is touched with a finger or the like, the upper electrode and the lower electrode are in contact with each other, so that signals are input to detectors 350 which are connected to the column line 309 and the row line 310. In the case where the detector is an ammeter, current flows through the detector. In the case where the detector is a voltmeter, voltage is applied to the detector. In FIG. 5A, the x coordinates are detected by the column lines and the y coordinates are detected by the row lines.

Note that this embodiment can be combined with the structure described in any of the other embodiments in this specification as appropriate.

(Embodiment 5)

In this embodiment, the operation of a resistive type touch panel which is different from that in Embodiment 4 is described.

Figure 5B:
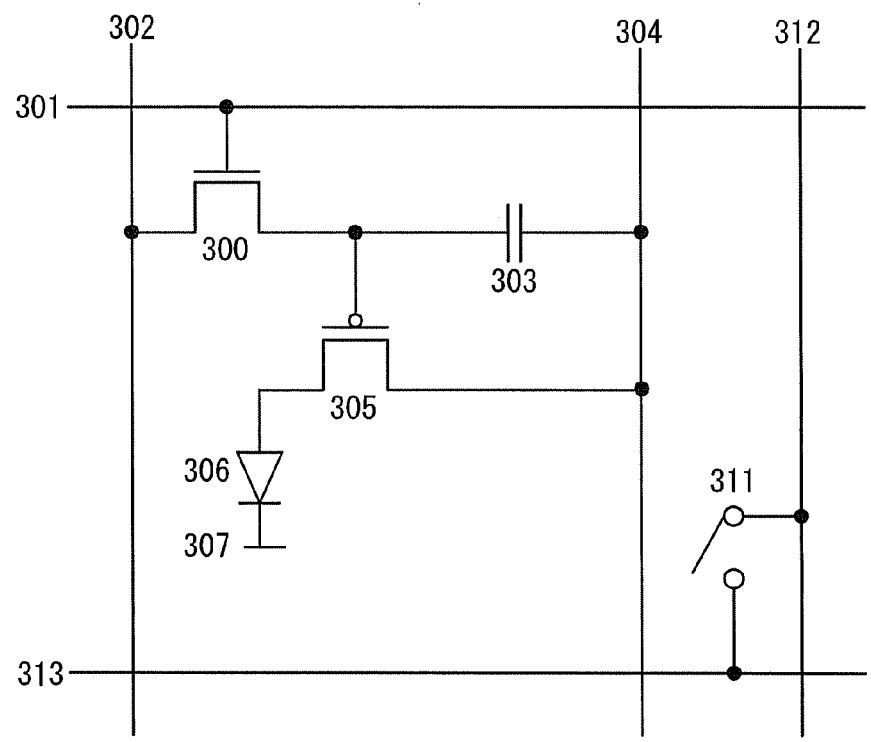
Figure 14:
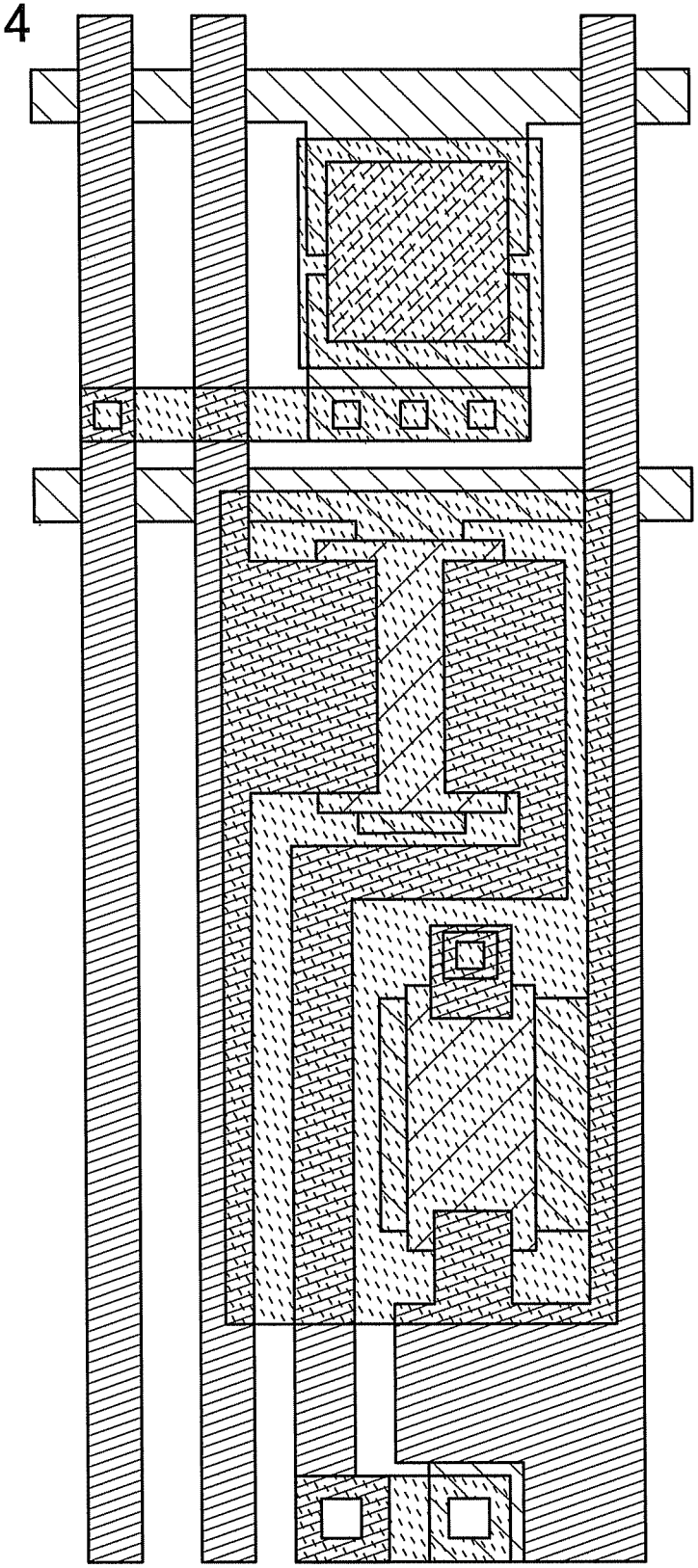
FIG. 14 is a top view according to one embodiment of the present invention.
Figure 16:
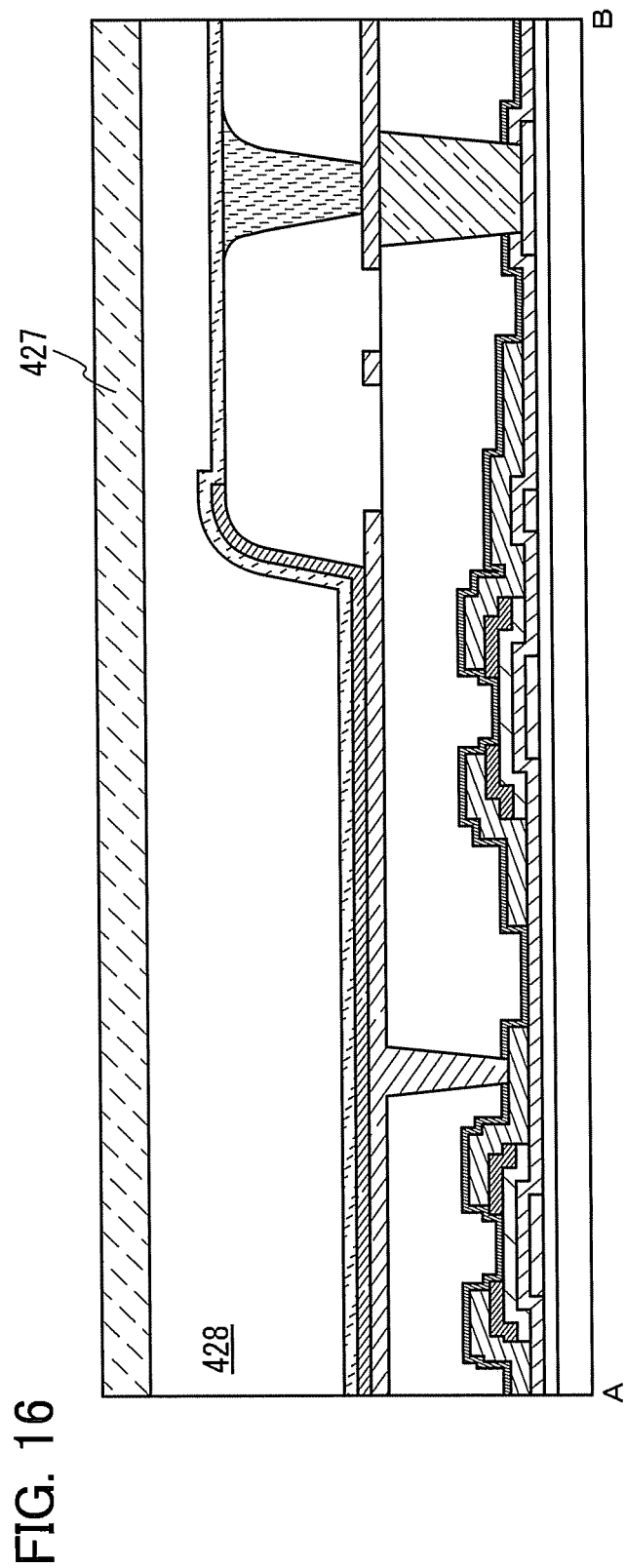
FIG. 16 is a cross-sectional view according to one embodiment of the present invention.
Figure 24:
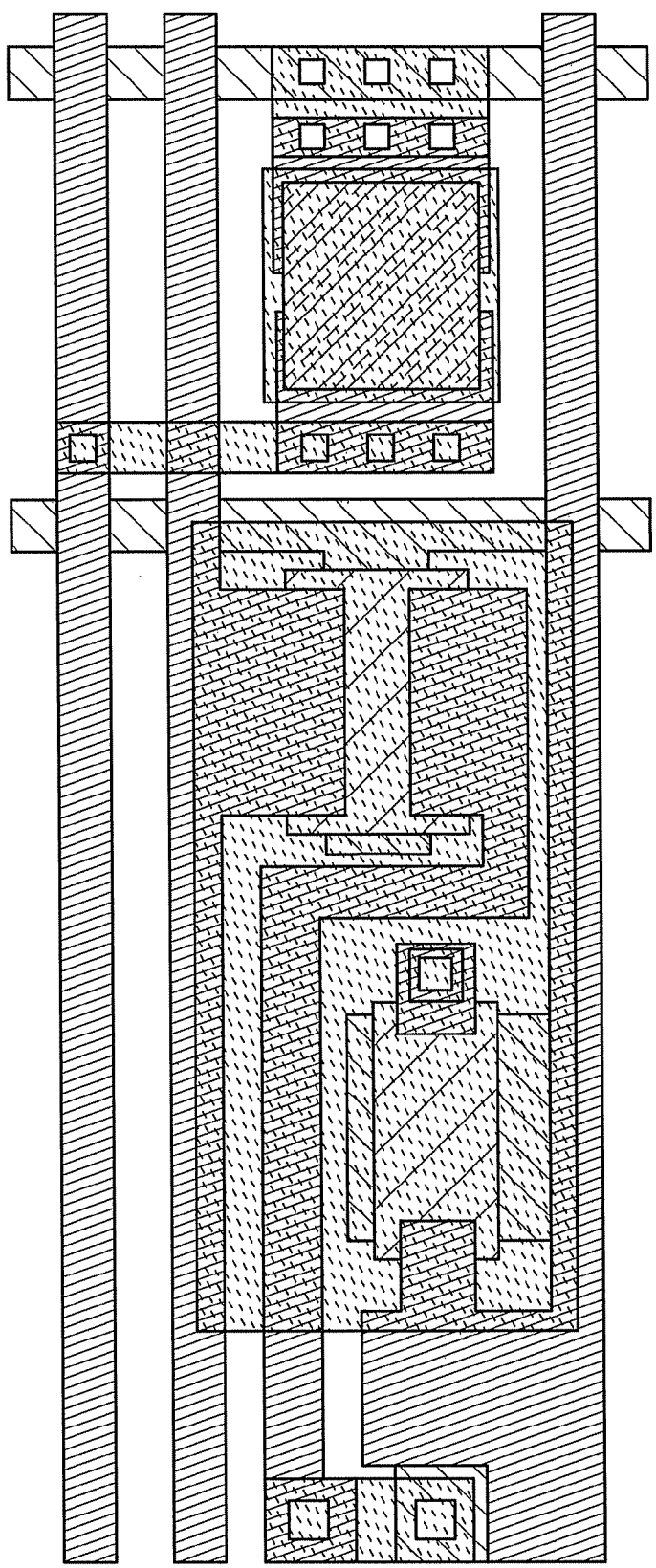
FIG. 24 is a top view according to one embodiment of the present invention.

FIG. 5B illustrates one embodiment of one pixel included in the resistive type touch panel. A top view of FIG. 5B is illustrated in FIG. 14 or FIG. 24, for example.

The switching transistor 300, the gate line 301, the source line 302, the capacitor 303, the power supply line 304, the driving transistor 305, the light-emitting element 306, and the power supply line 307 are similar to those in FIG. 5A. A first terminal of a switch 311 is electrically connected to a column line 312. A second terminal of the switch 311 is electrically connected to a power supply line 313. Although the upper electrode of the touch sensor is electrically connected to the power supply line 304 in FIG. 5A, the upper electrode of the touch sensor is not electrically connected to the power supply line 304 in FIG. 5B.

When the touch panel is touched with a finger or the like, the upper electrode is in contact with the lower electrode, so that a signal is input from the power supply line 313 to a detector which is connected to the column line 312. It is necessary to decide a potential of the power supply line 313 or the structure of the detector so that the x coordinates and the y coordinates can be detected. Thus, a touch position can be detected.

Note that this embodiment can be combined with the structure described in any of the other embodiments in this specification as appropriate.

(Embodiment 6)

In this embodiment, a material used for the filler layer 112 illustrated in FIGS. 1A and 1B is described. As described in Embodiment 1, a deformable porous material or an elastic insulating material can be used for the filler layer 112.

As the deformable porous material, it is preferable to use a material which is softened or hardened by certain treatment (e.g., heat treatment or chemical treatment) after formation. As such a material, a block copolymer or a graft copolymer, which forms a microphase separation structure, can be used, for example.

A block copolymer refers to a straight chain copolymer including a plurality of homopolymer chains as blocks linked together. For example, a diblock copolymer is given. Further, a block copolymer typified by a triblock copolymer, which includes three or more kinds of polymer chains linked together, may be used.

A graft copolymer refers to a copolymer having a structure in which other polymer chains as side chains are linked to the main chain of a polymer. The polymer chains linked as side chains may be of different kinds.

Note that as the material used for the filler layer 112, a block copolymer is preferably used. This is because with the block copolymer, a polymer with a narrow molecular weight distribution can be obtained easily and a composition ratio can be controlled comparatively easily. By controlling the composition ratio of the material used for the filler layer 112, the volume occupied by a hole per unit volume of the filler layer 112 can be controlled. Thus, the amount of deformation in the filler layer 112 for unit load can be varied. A block copolymer which can be applied to one embodiment of the present invention is described below.

Figure 7A:
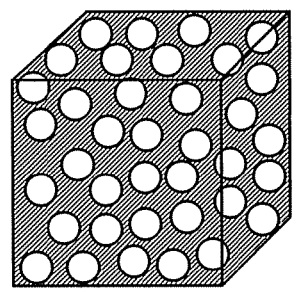
FIGS. 7A to 7G are diagrams each illustrating a block copolymer according to one embodiment of the present invention.
Figure 7D:
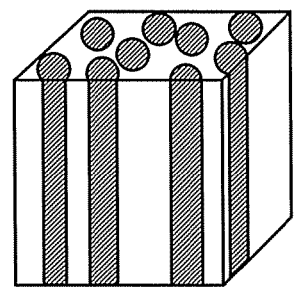
Figure 7B:
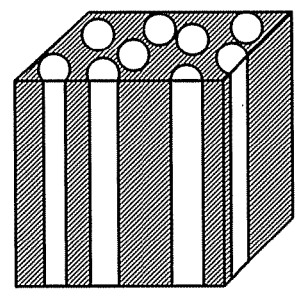
Figure 7E:
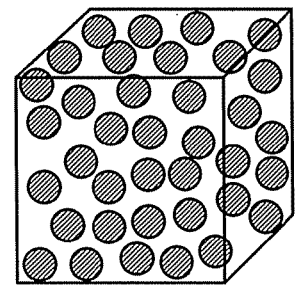
Figure 7C:
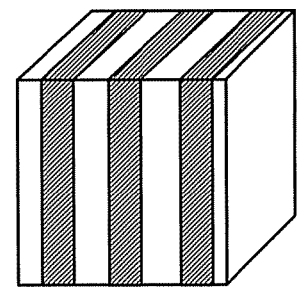
Figure 7F:
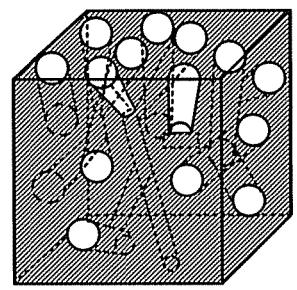
Figure 7G:
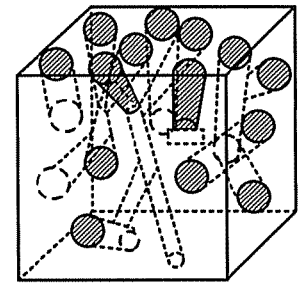

It is known that a block copolymer spontaneously forms a nanometer-scale microphase separation structure. For example, an AB block copolymer is microphase-separated to form a periodic structure such as a spherical structure, a cylinder structure, a gyroid structure, or a lamella structure depending on the composition ratio of a high molecular compound included in the block copolymer. Note that when the rate of one of components is less than or equal to approximately 20%, a spherical structure is formed (see FIG. 7A or FIG. 7E); when the rate is greater than or equal to approximately 20% and less than or equal to approximately 35%, a cylinder structure is formed (see FIG. 7B or FIG. 7D); when the rate is greater than or equal to approximately 35% and less than or equal to approximately 40%, a gyroid structure is formed (see FIG. 7F or FIG. 7G); and when the rate is greater than or equal to approximately 40%, a lamella structure is formed (see FIG. 7C). Note that a chemical solution does not easily reach a surface of the filler layer in wet etching and one of the components which should be removed is difficult to remove in the case of a spherical structure. Thus, a cylinder structure, a gyroid structure, or a lamella structure is preferably employed.

For production of a block copolymer, living polymerization can be used, for example. The living polymerization refers to a method by which polymerization of one kind of monomer is initiated by a polymerization initiator which generates anions or cations and a different monomer is sequentially added for synthesis, so that a block copolymer is produced. The production method is described below.

First, materials included in a block copolymer are dissolved in a solvent. This solvent is preferably a good solvent for all the plural kinds of polymers included in the block copolymer. Here, the good solvent refers to a solvent which can produce a homogeneous solution of the polymers included in the block copolymer. Since two kinds of polymers are used here, a homogeneous solution of the two kinds of polymers may be produced. For example, a toluene solution of about 5% by weight of the block copolymer is applied to a region where the filler layer 112 is formed with a spin coating method or the like. Note that although the solution is applied to the entire surface of a substrate by the spin coating method, the solution is applied to only a desired region with the use of a droplet discharge method, for example. Thus, a later process is simplified and material use efficiency is improved.

Next, heat treatment is performed on the substrate to which the solution is applied, and microphase separation is induced. Heat treatment temperature is set greater than or equal to the glass transition point of the components included in the block copolymer and less than or equal to the phase transition temperature thereof.

Note that there are different kinds of block copolymers, typically, a styrene-butadiene AB block copolymer and a styrene-isoprene AB block copolymer. Besides, there are a block copolymer including different materials, such as polymethylmethacrylate (PMMA); a block copolymer obtained by attaching a modified group to a terminal group of a styrene-isoprene block copolymer; and the like. Examples of a high molecular segment of the block copolymer include hydrophobic aromatic hydrocarbon chains such as polystyrene and polyfluorene, hydrophobic aliphatic unsaturation hydrocarbon chains such as polybutadiene and polyisoprene, hydrophilic aliphatic hydrocarbon chains such as polyvinyl alcohol and polyethylene glycol, hydrophilic aromatic hydrocarbon chains such as polystyrene sulfonic acid, hydrophobic siloxanes such as polydimethylsiloxane, metal complexes such as polyferrocene, and the like. Further, the block copolymer is linear, branched, or cyclic by covalent bond of two or more kinds of these high molecular segments at one or more bonding points.

The above material may further contain a solvent. Examples of the solvent include aliphatic hydrocarbons such as hexane, heptane, and octane; halogenated hydrocarbons such as carbon tetrachloride, chloroform, and dichloromethane; aromatic hydrocarbons such as benzene, toluene, and xylene; ketones such as acetone and methyl ethyl ketone; ethers such as dimethyl ether and diethyl ether; alcohols such as methanol and ethanol; water; and the like. The solvent can be selected from these solvents depending on properties or conditions of a material which is to be formed.

In this embodiment, the filler layer 112 can be formed and one of the components of the block copolymer can be selectively etched away. Further, an ABA block copolymer or a BAB block copolymer can have any of a variety of structures such as a spherical structure and a lamella structure depending on the composition of the block copolymer. Note that in the present invention, it is preferable to employ a cylinder structure, a gyroid structure, or a lamella structure, as described above.

Note that in this embodiment, a material which can be used for the filler layer 112 is not limited to the above materials and may be a material formed using plural kinds of substances, in which one kind of the substances can be removed by etching or the like in a later step. Further, although the substance removed by etching or the like is not necessarily one kind of the substances, it is necessary at the very least that at least one kind of the substances in the filler layer 112 be not removed after one kind of the substances is removed by etching or the like. Furthermore, heat resistance and chemical resistance are needed such that the material can withstand a process after the formation of the filler layer 112. Here, the substance remaining in the filler layer 112 without being removed is preferably a substance which is capable of elastic deformation.

Note that in this embodiment, the filler layer 112 can be formed using a block copolymer as described above. In the case where the filler layer 112 is formed using a block copolymer, porosity can be higher than or equal to approximately 20% and lower than or equal to 80% by making the volume of one of materials used for the filler layer 112 higher than or equal to 20% and lower than or equal to 80%. Thus, formation of the filler layer 112 itself or formation of the holes in the filler layer 112 can be performed favorably. The porosity is preferably higher than or equal to 20% and less than or equal to 60%. By making the porosity higher than or equal to 20% and less than or equal to 60%, the filler layer 112 has a cylinder structure, a gyroid structure, or a lamella structure. By making the porosity higher than or equal to 20% and less than or equal to 60%, the volume of the holes is less than the volume of the material used for the filler layer 112 even in the case where the filler layer 112 has a cylinder structure or a gyroid structure. Thus, the filler layer 112 is dense, so that sufficient mechanical strength can be secured. Still preferably, the porosity is higher than or equal to 20% and less than or equal to 35%. By making the porosity higher than or equal to 20% and less than or equal to 35%, the volume of the material used for the filler layer 112 is increased, so that the filler layer 112 has a cylinder structure having sufficient mechanical strength.

As described above, the filler layer 112 can be formed using a deformable porous material. However, this embodiment is not limited to this. For example, the filler layer 112 may be formed using an elastic insulating material. The case where the filler layer 112 is formed using an elastic insulating material is described below.

As the elastic insulating material, it is preferable to use a material which is softened or hardened by certain treatment (e.g., heat treatment or chemical treatment) after formation. As such a material, an elastomer or a thermoplastic elastomer can be used, for example. Formation can be easily performed when an elastomer or a thermoplastic elastomer is used, which is preferable.

Note that an elastomer refers to an organic resin material which has flexibility and impact resilience and has a Young's modulus of approximately $1.0 \times 10^6$ Pa to $1.0 \times 10^7$ Pa. An antonym of an elastomer is a plastomer.

As the material used for the filler layer 112, a polymer elastomer is preferably used. As the polymer elastomer, a polyurethane resin, an ethylene-vinyl acetate resin, an ethylene-ethyl acrylate resin, a polyester resin, a polyamide resin, synthetic rubber such as butadiene rubber, butyl rubber, styrene-butadiene rubber, nitrile rubber, isoprene rubber, chloroprene rubber, or silicone rubber, or a deformed material thereof can be used; however, this embodiment is not limited to this. One or more kinds of the above materials may be used. Alternatively, elastic modulus may be adjusted by addition of a plasticizer or the like.

As a formation method of the polymer elastomer, a dipping method, a coating method, a screen printing method, a gravure printing method, a spray coating method, a droplet discharge method, or the like may be used, for example. In the case where the polymer elastomer is formed using such a method, it is necessary to solidify the elastomer after a solution containing the material used for the polymer elastomer as a solute is formed. Therefore, the polymer elastomer used for the filler layer 112 is preferably an elastomer which is dried at normal temperature or a normal-temperature cross-linked elastomer. When an elastomer which is dried at normal temperature or a normal-temperature cross-linked elastomer is used, treatment for solidifying the elastomer (e.g., heat treatment or drying treatment) is not needed, so that a manufacturing process is simplified.

Note that the elastomer which is dried at normal temperature or the normal-temperature cross-linked elastomer refers not only to an elastomer which is dried at normal temperature or an elastomer which forms a cross link at normal temperature but also to an elastomer which is dried at a temperature slightly higher than normal temperature or an elastomer which forms a cross link at a temperature slightly higher than normal temperature. In addition, as a solvent in the elastomer dried at normal temperature, it is preferable to use a solvent whose boiling temperature is slightly higher than normal temperature rather than a solvent whose boiling temperature is substantially the same as normal temperature. This is because boiling might occur at the time of formation when a solvent whose boiling temperature is substantially the same as normal temperature is used. For example, it is preferable to use benzene (whose boiling temperature is 80° C.) or chloroform (whose boiling temperature is 61° C.) rather than methylene chloride (whose boiling temperature is 40° C.) or acetone (whose boiling temperature is 56° C.). Further, any of the solvents which might evaporate after being left for a certain period of time can be used.

Note that the normal temperature generally refers to a temperature range from 15 to 25° C.; however, the present invention is not limited to this. As the elastomer which is dried at normal temperature or the normal-temperature cross-linked elastomer, an elastomer which is dried at approximately 0 to 100° C. or an elastomer which forms a cross link at approximately 0 to 100° C. may be used. It is needless to say that drying or the formation of a cross link is preferably performed at low temperature within the above temperature range.

As the formation method of the elastomer or the thermoplastic elastomer used for the filler layer 112, a spin coating method is most preferably used. This is because the filler layer 112 can be formed without generation of unevenness in the thickness and quality of the filler layer 112 with the use of a spin coating method. By making uniformity in the thickness and quality of the filler layer 112 higher, generation of unevenness in strength distribution of the filler layer 112 can be prevented. Thus, yield and reliability are improved, which is preferable.

The elastomer which is dried at normal temperature can be formed by dissolution of a solid body of a polymer elastomer into an organic solvent which volatilizes at normal temperature. For example, solvent-diluting urethane, solvent-diluting acrylic, or the like may be used.

As the normal-temperature cross-linked elastomer, a moisture-curable elastomer which is cured by absorption of moisture contained in the air or an elastomer which is cured with energy such as an ultraviolet (UV) ray, an electron beam (EB), or visible light (an UV curable elastomer, an EB curable elastomer, or a visible light curable elastomer) may be used. In the case where a visible light curable elastomer is used, it is acceptable that certain processing is performed in a space which is shielded from visible light and exposure to visible light is performed only when the elastomer is cured. By using the visible light curable elastomer, the filler layer 112 can be formed while a layer which has been formed is not irradiated with an ultraviolet ray, an electron beam, or the like. Thus, an apparatus for irradiation with an ultraviolet ray, an electron beam, or the like is not needed, which is preferable. The visible light curable elastomer can be formed in such a manner that an elastomer is dissolved in an organic solvent or the like or an elastomer is dispersed into water. Alternatively, the visible light curable elastomer can be formed without the use of a medium such as a solvent.

In the case where the solid body of the polymer elastomer is dispersed into water to be applied, it is difficult to form the elastomer uniformly. This is because solid ink includes many hydrophobic components. Thus, it is preferable to form the elastomer without being dispersed into water. As the normal-temperature cross-linked elastomer, a moisture-curable urethane resin, an UV curable acrylic resin, or the like can be used, for example. The elastomer which is dried at normal temperature and the normal-temperature cross-linked elastomer can be formed at not so high temperature, so that the filler layer 112 can be formed without transformation or the like of the layer which has been formed.

In addition, since it is difficult to process an elastomer into a desired shape, a thermoplastic elastomer may be used. The use of a thermoplastic elastomer is preferable because shaping is facilitated. That is, the use of a thermoplastic elastomer is preferable because processing into a variety of shapes or processing with high accuracy is facilitated.

Note that the thermoplastic elastomer refers to an elastomer which has flexibility, impact resilience, and the like at normal temperature and exhibits plasticity by heating. As the thermoplastic elastomer, a urethane type, a styrene type, a vinyl type, an ester type, and the like are used; however, the material of the thermoplastic elastomer is not limited to a certain material. Alternatively, a material which exhibits plasticity with certain treatment may be used.

Note that in the case where a porous material is used for the filler layer 112, it is necessary to etch away any of the materials included in a block copolymer. A step of etching away any of the materials included in the block copolymer is described below.

In order to remove one of components of the block copolymer, dry etching or wet etching can be used. For example, reactive ion etching (RIE) in an oxygen gas atmosphere can be used. It is preferable to employ a condition that etching rates of a component which should be removed and a component which should remain in the block copolymer are greatly different from each other. In general, the higher the content of carbon molecules per unit molecule contained in a polymer molecular chain is, the higher etching resistance is; the higher the content of oxygen molecules per segment is, the lower etching resistance is. For example, since polystyrene (PS) contains an aromatic ring, the content of carbon molecules in a block copolymer of polystyrene-polymethylmethacrylate (PS-PMMA) is high. Thus, the etching resistance of the block copolymer is high. The etching resistance of polyacrylamide (PAAM) is low because the content of oxygen molecules is high. In the case of employing RIE, the etching rate of one of these two kinds of components is generally four times that of the other.

Note that a gas used for the etching is not limited to an oxygen gas and may be $CF_4$, $H_2$, $C_2F_6$, $CHF_3$, $CH_2F_2$, $CF_3Br$, $NF_3$, $Cl_2$, $CCl_4$, HBr, $SF_6$ or the like.

Note that the etching rate is determined per monomer unit of a block copolymer. It is known that when N denotes the total number of atoms per monomer unit, Nc denotes the number of carbon atoms per monomer unit, and No denotes the number of oxygen atoms per monomer unit, the etching rate is proportional to $N/(Nc-No)$.

However, in the above dry etching, although there is no problem in the case of a cylinder structure or the like, many portions could fail to be etched in the case of a spherical structure. Thus, in the case of a spherical structure, wet etching is preferably used. Through wet etching, one of the components can be etched depending on the material used for the formed block copolymer and the other of the components may be etched under a condition of high etching resistance. However, in consideration of the above circumstances, it is still preferable to employ a cylinder structure, a gyroid structure, or a lamella structure.

Further, a method for removing the component which should be removed is not necessarily limited to etching. If possible, the component which should be removed may be removed with evaporation, sublimation, or the like by heat treatment or the like.

In the case where a block copolymer is used, the formation of the filler layer 112 is completed through the above steps.

Note that in FIGS. 1A and 1B, the filler layer 112 is formed in such a manner that an opening formed in the insulating layer 111 is filled with the material used for the filler layer 112. Alternatively, after the material used for the filler layer 112 is formed over the insulating layer 111, the material used for the filler layer 112 is processed into a desired shape to form the filler layer 112.

In the microstructure according to one embodiment of the present invention, unlike a conventional microstructure, a deformable material is filled between the upper electrode and the lower electrode. Thus, a microstructure having mechanical strength higher than a conventional microstructure including a hollow portion can be formed. Improvement in mechanical strength makes it possible to prevent generation of a defect in a manufacturing process or operation. Thus, yield and reliability are improved.

Note that this embodiment can be combined with the structure described in any of the other embodiments in this specification as appropriate.

(Embodiment 7)

In this embodiment, structures of a touch panel which is one embodiment of the present invention are described with reference to FIG. 8, FIG. 9, FIG. 10, FIG. 11, FIG. 12, FIGS. 15A to 15C, FIG. 16, and FIG. 17. FIG. 8, FIG. 9, FIG. 10, FIG. 11, and FIG. 12 are top views of one pixel of the touch panel which is one embodiment of the present invention. FIGS. 15A to 15C, FIG. 16, and FIG. 17 are cross-sectional views taken along line A-B in FIG. 12. Note that for simplicity, FIG. 8, FIG. 9, FIG. 10, FIG. 11, and FIG. 12 illustrate gate electrodes 402 and 403, a wiring 404, a lower electrode 405, a row line (a line for detecting a y coordinate) 450, first semiconductor layers 407 and 408, conductive layers 413, 414, 415, and 416, a column line (a line for detecting an x coordinate) 451, a filler layer 419, a first electrode 420, a wiring 421, and an upper electrode 422. Further, the touch panel described in this embodiment is a touch panel which includes the capacitive type touch sensor described in Embodiment 2 or the resistive type touch sensor described in Embodiment 4.

A base film 401 is formed over a substrate 400 (see FIG. 15A). As the substrate 400, a plastic substrate having heat resistance enough to withstand the processing temperature of a transistor, or the like as well as a glass substrate formed with a fusion method or a float method, such as a barium borosilicate glass substrate, an aluminoborosilicate glass substrate, or an aluminosilicate glass substrate, a ceramic substrate can be used. Alternatively, a metal substrate such as a stainless steel alloy substrate which is provided with an insulating film over a surface may be used.

The base film 401 is formed using a single-layer structure or a layered structure of an insulating film such as a silicon oxide-based material film or a silicon nitride-based material. Note that the silicon oxide-based material refers to silicon oxide containing oxygen and silicon as main components, or silicon oxynitride which is silicon oxide containing nitrogen, in which the content of oxygen is higher than that of nitrogen. The silicon nitride-based material refers to silicon nitride containing nitrogen and silicon as main components, or silicon nitride oxide which is silicon nitride containing oxygen, in which the content of nitrogen is higher than that of oxygen.

A transistor is formed over the base film 401. The transistor may have any shape and may be formed with any method. In this embodiment, a bottom-gate (inverted-staggered) transistor, particularly, a channel-etched transistor is described.

Figure 8:
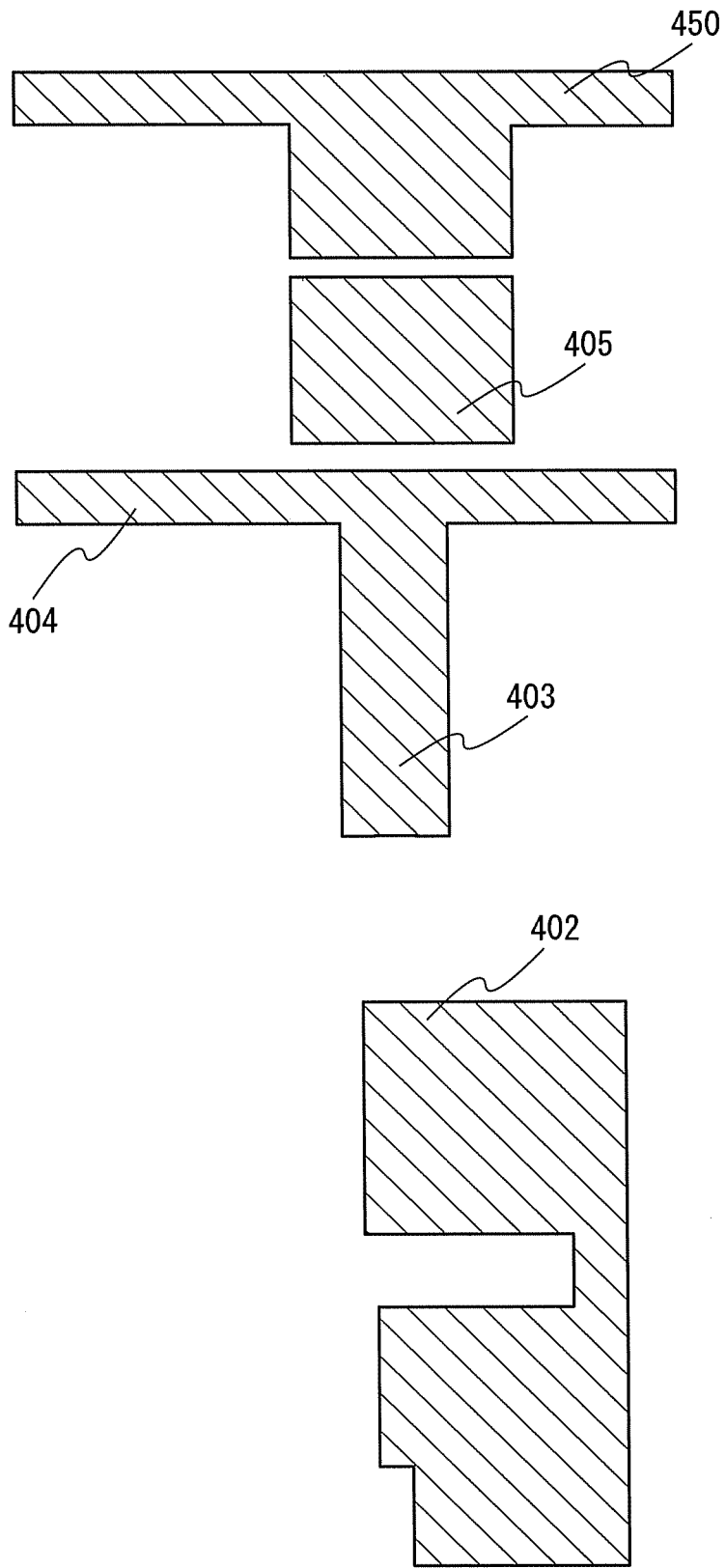
FIG. 8 is a top view according to one embodiment of the present invention.

The gate electrodes 402 and 403, the wiring 404, and the lower electrode 405 of a microstructure (MEMS) are formed over the base film 401 (see FIG. 8 and FIG. 15A). After a conductive film is formed over the base film 401, the conductive film is etched as in FIG. 8. Thus, the gate electrodes 402 and 403, the wiring 404, and the lower electrode 405 are formed using the same material. The gate electrodes 402 and 403, the wiring 404, and the lower electrode 405 can be formed using a conductive metal or a semiconductor material, such as titanium, molybdenum, tantalum, chromium, tungsten, aluminum, neodymium, copper, silver, gold, platinum, niobium, silicon, zinc, iron, barium, or germanium; or an alloy material thereof with sputtering, CVD, or the like. Alternatively, the gate electrodes 402 and 403, the wiring 404, and the lower electrode 405 may be formed by stacking two or more kinds of conductive materials. Further, side surfaces of the gate electrodes 402 and 403 may be etched to be tapered. Note that in FIG. 8, reference numeral 450 denotes a row line (a line for detecting a y coordinate). The row line 450 is formed using the same material as the gate electrodes 402 and 403, the wiring 404, and the lower electrode 405.

An insulating film 406 is formed over the gate electrodes 402 and 403, the wiring 404, and the lower electrode 405 (see FIG. 15A). The insulating film 406 can be formed using a silicon oxide-based material, a silicon nitride-based material, or the like with plasma-enhanced CVD, sputtering, or the like. Alternatively, the insulating film 406 can be formed by high-density plasma treatment. Here, high-density plasma treatment refers to plasma treatment where plasma density is higher than or equal to $1\times10^{11}$ cm$^{-3}$, preferably, higher than or equal to $1\times10^{11}$ cm$^{-3}$ and lower than or equal to $9\times10^{15}$ cm$^{-3}$ and a high-frequency wave such as a microwave (e.g., a frequency of 2.45 GHz) is used. When plasma is generated under such a condition, low electron temperature is higher than or equal to 0.2 eV and lower than or equal to 2.0 eV. Since such high-density plasma at low electron temperature has low kinetic energy of active species, it is possible to form a film with little plasma damage and fewer defects. In the insulating film formed by the high-density plasma treatment in this manner, the state of an interface between the insulating film and a layer which is in contact with the insulating film is improved. Thus, when the insulating film 406 is formed by high-density plasma treatment, the state of an interface between the insulating film 406 and the semiconductor layer can be improved. Accordingly, electrical properties of a semiconductor element can be improved.

Figure 9:
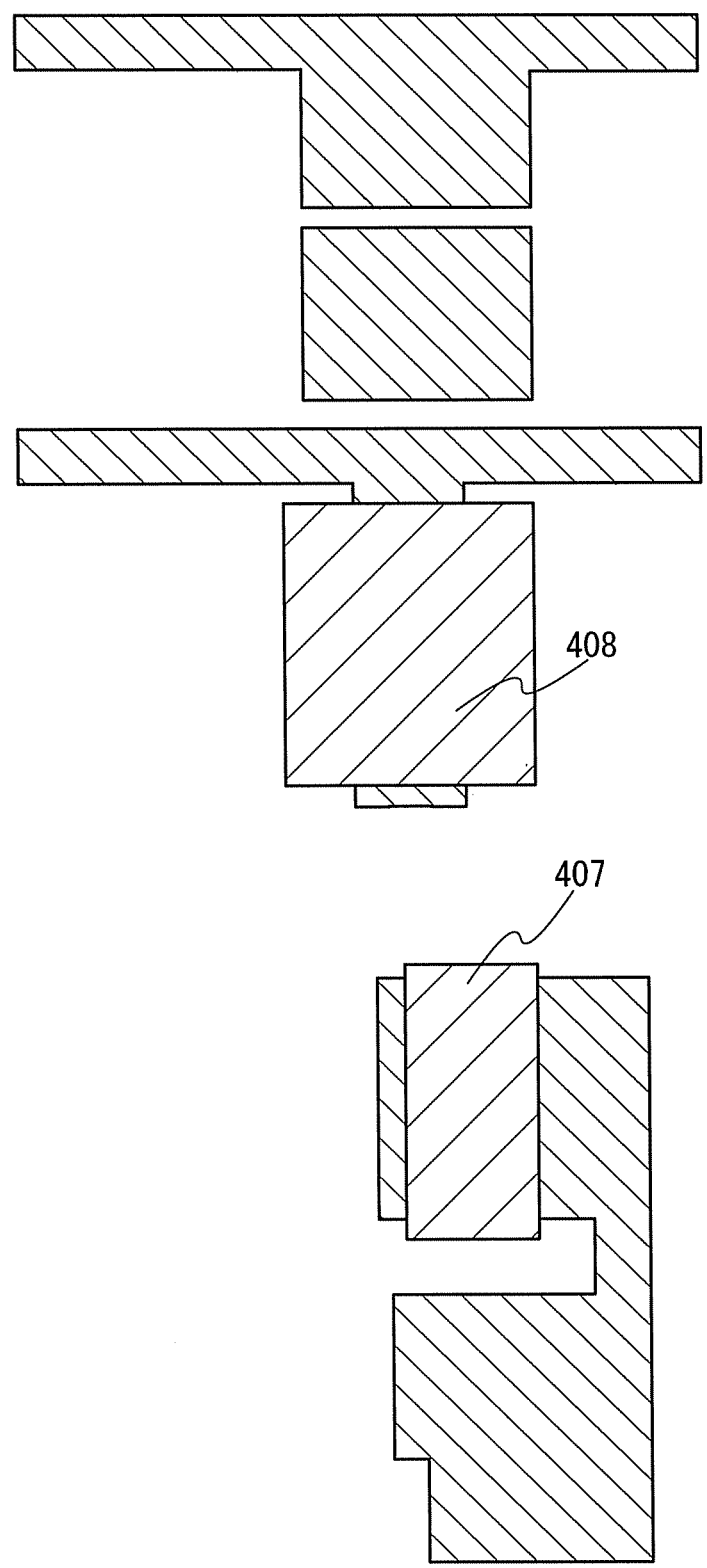
FIG. 9 is a top view according to one embodiment of the present invention.

The first semiconductor layers 407 and 408 are formed over the insulating film 406 (see FIG. 9 and FIG. 15A). The first semiconductor layer 407 is formed so as to overlap with the gate electrode 402 with the insulating film 406 therebetween. The first semiconductor layer 408 is formed so as to overlap with the gate electrode 403 with the insulating film 406 therebetween. The first semiconductor layers 407 and 408 can be formed using a non-crystalline semiconductor layer formed using amorphous silicon (a-Si:H) or the like, microcrystalline silicon (μ-Si:H), polycrystalline silicon, single crystal silicon, a compound semiconductor such as gallium arsenide (GaAs), or an oxide semiconductor such as zinc oxide (ZnO) or an In—Ga—Zn—O-based oxide semiconductor with photolithography, an ink-jet method, a printing method, or the like. Note that the first semiconductor layers 407 and 408 have portions functioning as channel regions of the transistors.

In the case where amorphous silicon (a-Si:H) or microcrystalline silicon is used for the first semiconductor layers 407 and 408, there are advantages that the characteristics of the transistors are uniform and that manufacturing cost is low. In particular, the use of amorphous silicon (a-Si:H) or microcrystalline silicon is effective in forming transistors over a large substrate whose diagonal length exceeds 500 mm.

In the case where polycrystalline silicon is used for the first semiconductor layers 407 and 408, there are advantages that the transistors have high mobility and that manufacturing cost is low. Further, since deterioration in characteristics over time is little, a highly reliable device can be obtained.

In the case where an oxide semiconductor is used for the first semiconductor layers 407 and 408, field effect mobility can be higher than that of a thin film transistor including amorphous silicon. An oxide semiconductor film can be formed with sputtering or the like at a temperature of 300° C. or lower, and a manufacturing process thereof is simpler than that of a thin film transistor including polycrystalline silicon.

Note that as an example of an oxide semiconductor which can be used in this specification, there is an oxide semiconductor represented by $InMO_3(ZnO)_m$ (m>0). Here, M is one or more metal elements selected from gallium (Ga), iron (Fe), nickel (Ni), manganese (Mn), or cobalt (Co). For example, the case where Ga is selected as M includes not only the case where only Ga is used but also the case where Ga and the above metal element other than Ga, such as Ni or Fe, are selected. Further, in the oxide semiconductor, in some cases, a transitional metal element such as Fe or Ni or an oxide of the transitional metal is contained as an impurity element in addition to the metal element contained as M. In this specification, among the oxide semiconductors, an oxide semiconductor containing at least gallium as M is referred to as an In—Ga—Zn—O-based oxide semiconductor, and a thin film formed using the material is referred to as an In—Ga—Zn—O-based non-single-crystal film in some cases.

Second semiconductor layers 409 and 410 are formed over the first semiconductor layer 407, and second semiconductor layers 411 and 412 are formed over the first semiconductor layer 408 (see FIG. 15A). The second semiconductor layer 409 has a portion functioning as one of a source and a drain. The second semiconductor layer 410 has a portion functioning as the other of the source and the drain. The second semiconductor layer 411 has a portion functioning as one of a source and a drain. The second semiconductor layer 412 has a portion functioning as the other of the source and the drain. Note that for the second semiconductor layers, silicon containing phosphorus or the like, a semiconductor material having higher conductivity than the first semiconductor layer, an oxide semiconductor having higher carrier concentration than the first semiconductor layer, or the like can be used. The second semiconductor layers can be each referred to as a buffer layer or an n+ layer depending on its function.

Figure 10:
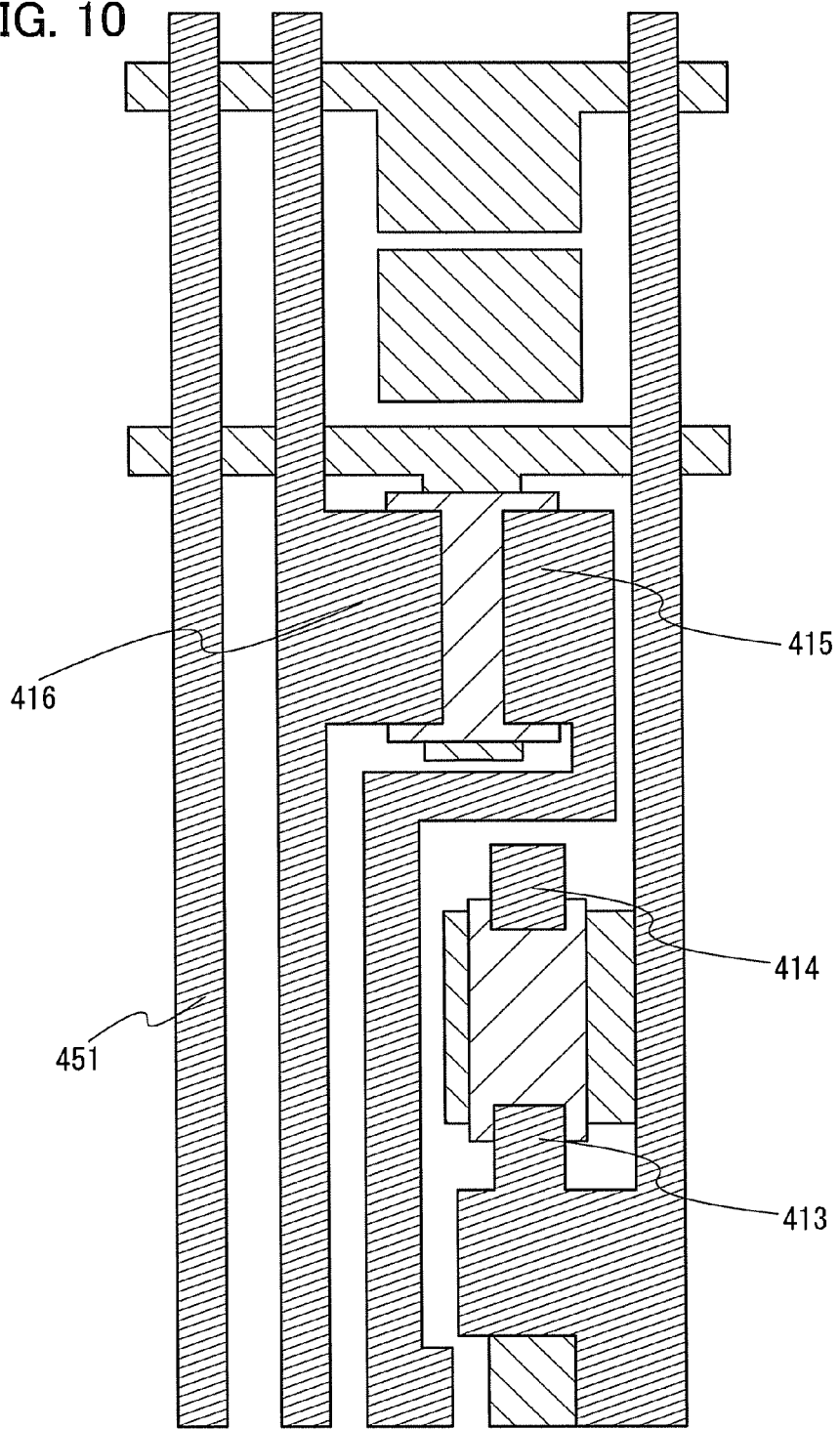
FIG. 10 is a top view according to one embodiment of the present invention.
Figure 11:
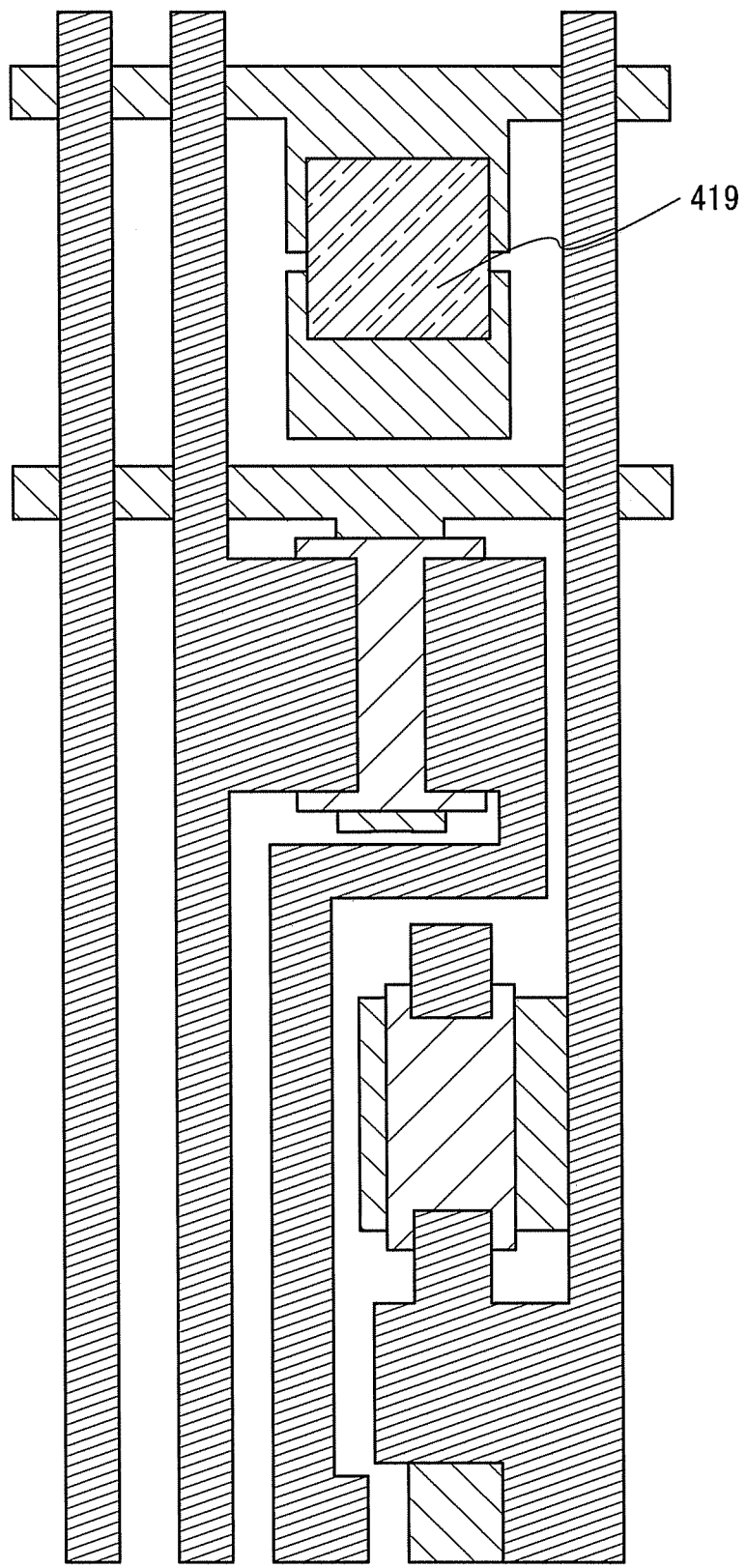
FIG. 11 is a top view according to one embodiment of the present invention.

The conductive layers 413, 414, 415, and 416 are formed over the second semiconductor layers 409, 410, 411, and 412 (see FIG. 10 and FIG. 15B). The conductive layer 413 has a portion functioning as one of a source and a drain. The conductive layer 414 has a portion functioning as the other of the source and the drain. The conductive layer 415 has a portion functioning as one of a source and a drain. The conductive layer 416 has a portion functioning as the other of the source and the drain. The conductive layers 413, 414, 415, and 416 can be formed using a conductive metal or a semiconductor material, such as titanium, molybdenum, tantalum, chromium, tungsten, aluminum, neodymium, copper, silver, gold, platinum, niobium, silicon, zinc, iron, barium, or germanium; or an alloy material thereof with sputtering, CVD, or the like. Note that in FIG. 10, reference numeral 451 denotes a column line (a line for detecting an x coordinate). The column line 451 is formed using the same material as the conductive layers 413, 414, 415, and 416.

A passivation film 417 is formed over the conductive layers 413, 414, 415, and 416 (see FIG. 15B). An insulating film formed using silicon nitride or the like can be used as the passivation film 417.

An insulating layer 418 is formed over the passivation film 417 (see FIG. 15B). The insulating layer 418 is formed using a silicon oxide-based material film or a silicon nitride-based material film. In addition, for the insulating layer 418, an organic resin such as polyimide, polyamide, acrylic (including photosensitive acrylic), or benzocyclobutene (BCB) can be used. Further, the insulating layer 418 may have either a single-layer structure or a layered structure.

By etching the insulating layer 418, part of the conductive layer 414 and part of the lower electrode 405 are exposed so that contact holes are formed. Next, the filler layer 419 is formed so as to fill the contact hole formed (see FIG. 11 and FIG. 15B). A deformable porous material or an elastic insulating material can be used for the filler layer 419, and any of the materials described in Embodiment 6 can be used.

Note that the filler layer 419 is formed in such a manner that the contact hole formed in the insulating layer 418 is filled with the material used for the filler layer 419. Alternatively, after the material used for the filler layer 419 is formed over the insulating layer 418, the material used for the filler layer 419 is processed into a desired shape to form the filler layer 419.

A conductive layer is formed over the insulating layer 418 and the filler layer 419 and is etched to have a desired shape, so that the first electrode 420, the wiring 421, and the upper electrode 422 of the microstructure (MEMS) are formed (see FIG. 12 and FIG. 15C). The upper electrode 422 is formed so as to overlap with the lower electrode 405 with the filler layer 419 therebetween. The first electrode 420, the wiring 421, and the upper electrode 422 can be formed using a conductive metal or a semiconductor material, such as titanium, molybdenum, tantalum, chromium, tungsten, aluminum, neodymium, copper, silver, gold, platinum, niobium, silicon, zinc, iron, barium, or germanium; or an alloy material thereof with sputtering, CVD, or the like.

A partition wall 423 which covers an end portion of the first electrode 420 and has an opening reaching the upper electrode 422 is formed (see FIG. 15C). For the partition wall 423, an organic resin film, an inorganic resin film, or an organic polysiloxane can be used. Specifically, the partition wall 423 is preferably formed using polyimide, polyamide, polyimide amide, acrylic, or a benzocyclobutene-based resin. It is particularly preferable that the partition wall 423 be formed using a photosensitive material to have an opening over the first electrode 420 and the upper electrode 422 so that a sidewall of the opening is formed as a tilted surface with continuous curvature.

A spacer 424 is formed so as to fill the opening in the partition wall 423 reaching the upper electrode 422 (see FIG. 15C). An ultraviolet curable resin or the like can be used for the spacer 424. Specifically, the spacer 424 may be formed using an ultraviolet curable acrylic resin or the like. Note that the spacer 424 is formed so as to overlap with the lower electrode 405.

Here, among the materials used for the filler layer 419, the partition wall 423, and the spacer 424, the material used for the spacer 424 is the hardest material and the material used for the filler layer 419 is the softest material. Elastic modulus or the like indicates hardness or softness. The elastic modulus is a physical value indicating an object's tendency to be deformed elastically. In the case where hardness or softness is indicated by elastic modulus, the elastic modulus of the material used for the spacer 424 is higher than the elastic modulus of the material used for the partition wall 423, and the elastic modulus of the material used for the partition wall 423 is higher than the elastic modulus of the material used for the filler layer 419.

An EL layer 425 is formed over the first electrode 420 (see FIG. 15C). The EL layer 425 includes a hole injection layer, a hole transport layer, a light-emitting layer, an electron transport layer, an electron injection layer, a hole blocking layer, and the like. The material used for the EL layer 425 may be selected as appropriate.

A second electrode 426 is formed over the EL layer 425 and the partition wall 423 (see FIG. 15C). The first electrode 420, the EL layer 425, and the second electrode 426 are included in a light-emitting element. The second electrode 426 can be formed using a light-transmitting conductive material. As the light-transmitting conductive material, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, or the like can be used. The film formed using the light-transmitting conductive material may be formed with sputtering, CVD, or the like; however, this embodiment is not limited to a particular method. Further, the second electrode 426 may have either a single-layer structure or a layered structure.

Through the above steps, an element substrate can be formed. Then, sealing is performed in such a manner that a sealant (not illustrated) is provided at an end portion of the element substrate and the element substrate and a sealing substrate 427 are attached to each other with the sealant (see FIG. 16). The touch panel which is one embodiment of the present invention has a structure where a light-emitting element is provided in a space 428 surrounded by the element substrate, the sealing substrate 427, and the sealant. The space 428 is filled with an inert gas (e.g., nitrogen or argon). The space 428 may be filled with a sealant as a substitute for the inert gas.

Note that an epoxy-based resin is preferably used for the sealant. In addition, it is preferable to use a material which does not transmit moisture or oxygen as much as possible. Further, as the sealing substrate 427, a glass substrate, a plastic substrate formed using fiberglass-reinforced plastics (FRP), polyvinyl fluoride (PVF), polyester, acrylic, or the like can be used.

Figure 17:
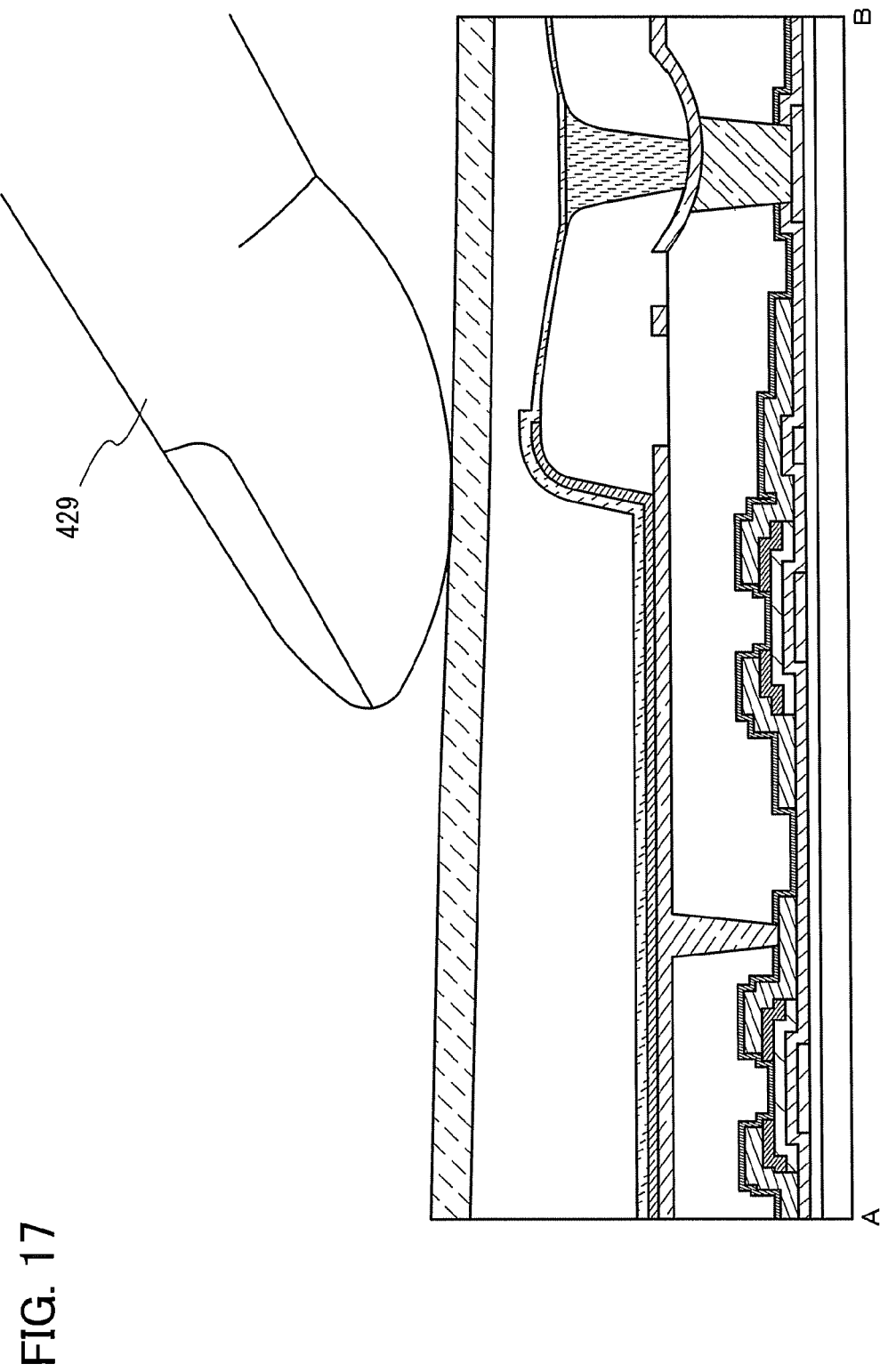
FIG. 17 is a cross-sectional view according to one embodiment of the present invention.

Next, FIG. 17 illustrates the case where the touch panel is touched with a finger.

As illustrated in FIG. 17, when the sealing substrate 427 is touched with a finger 429, the sealing substrate 427 bends. In this case, an upper portion of the partition wall 423 is pressed and dented, and the spacer 424 which is harder (which has higher elastic modulus) than the material used for the partition wall 423 is pressed down. Since the filler layer 419 provided below the spacer 424 is softer (has lower elastic modulus) than the spacer 424, the spacer 424 is pressed down without deformation. The upper electrode 422 of the microstructure (MEMS) is pressed down when the spacer 424 is pressed down. In the case of the capacitive type touch panel, the distance between the lower electrode 405 and the upper electrode 422 of the microstructure (MEMS) is changed. Thus, data can be input. In the case of the resistive type touch panel, the lower electrode 405 and the upper electrode 422 of the microstructure (MEMS) are in contact with each other. Thus, data can be input.

According to one embodiment of the present invention, a touch sensor can be formed in steps of forming a thin film transistor and a light-emitting element.

According to one embodiment of the present invention, a touch sensor and a light-emitting element are disposed, so that it is possible to provide a thin touch panel with less degradation in image quality as compared to the case where a touch sensor is provided above or below a light-emitting element.

According to one embodiment of the present invention, by using materials having different hardness for a filler layer, a partition wall, and a spacer, it is possible to provide a touch panel where data can be input efficiently and pressure is not applied to a light-emitting element easily. Further, by providing a spacer above a touch sensor, durability and sensitivity of the touch sensor can be improved.

Note that this embodiment can be combined with the structure described in any of the other embodiments in this specification as appropriate.

(Embodiment 8)

In this embodiment, structures of a touch panel which is different from that in Embodiment 7 are described with reference to FIG. 18, FIG. 19, FIG. 20, FIG. 21, FIG. 22, FIGS. 25A to 25C, FIG. 26, and FIG. 27. FIG. 18, FIG. 19, FIG. 20, FIG. 21, and FIG. 22 are top views of one pixel of the touch panel which is one embodiment of the present invention. FIGS. 25A to 25C, FIG. 26, and FIG. 27 are cross-sectional views taken along line C-D in FIG. 22. Note that for simplicity, FIG. 18, FIG. 19, FIG. 20, FIG. 21, and FIG. 22 illustrate gate electrodes 502 and 503, a wiring 504, a row line (a line for detecting a y coordinate) 550, first semiconductor layers 506 and 507, conductive layers 512, 513, 514, and 515, a lower electrode 516, a column line (a line for detecting an x coordinate) 551, a filler layer 519, a first electrode 520, a wiring 521, and an upper electrode 522. Further, the touch panel described in this embodiment is a touch panel which includes the capacitive type touch sensor described in Embodiment 2 or the resistive type touch sensor described in Embodiment 4.

Figure 25A:
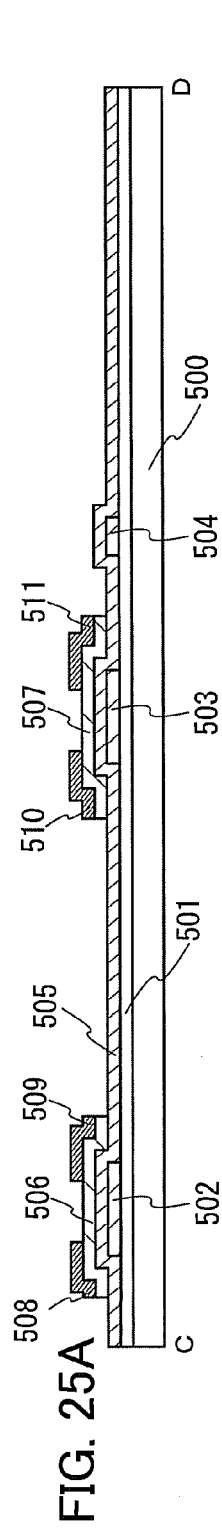
FIGS. 25A to 25C are cross-sectional views according to one embodiment of the present invention.

A base film 501 is formed over a substrate 500 (see FIG. 25A). As the substrate 500, a plastic substrate having heat resistance enough to withstand the processing temperature of a transistor, or the like as well as a glass substrate formed with a fusion method or a float method, such as a barium borosilicate glass substrate, an aluminoborosilicate glass substrate, or an aluminosilicate glass substrate, a ceramic substrate can be used. Alternatively, a metal substrate such as a stainless steel alloy substrate which is provided with an insulating film over a surface may be used.

The base film 501 is formed using a single-layer structure or a layered structure of an insulating film such as a silicon oxide-based material film or a silicon nitride-based material. Note that the silicon oxide-based material refers to silicon oxide containing oxygen and silicon as main components, or silicon oxynitride which is silicon oxide containing nitrogen, in which the content of oxygen is higher than that of nitrogen. The silicon nitride-based material refers to silicon nitride containing nitrogen and silicon as main components, or silicon nitride oxide which is silicon nitride containing oxygen, in which the content of nitrogen is higher than that of oxygen.

A transistor is formed over the base film 501. The transistor may have any shape and may be formed with any method. In this embodiment, a bottom-gate (inverted-staggered) transistor, particularly, a channel-etched transistor is described.

The gate electrodes 502 and 503 and the wiring 504 are formed over the base film 501 (see FIG. 25A). After a conductive film is formed over the base film 501, the conductive film is etched as in FIG. 18. The gate electrodes 502 and 503 and the wiring 504 can be formed using a conductive metal or a semiconductor material, such as titanium, molybdenum, tantalum, chromium, tungsten, aluminum, neodymium, copper, silver, gold, platinum, niobium, silicon, zinc, iron, barium, or germanium; or an alloy material thereof with sputtering, CVD, or the like. Alternatively, the gate electrodes 502 and 503 and the wiring 504 may be formed by stacking two or more kinds of conductive materials. Further, side surfaces of the gate electrodes 502 and 503 may be etched to be tapered. Note that in FIG. 18, reference numeral 550 denotes a row line (a line for detecting a y coordinate). The row line 550 is formed using the same material as the gate electrodes 502 and 503 and the wiring 504.

An insulating film 505 is formed over the gate electrodes 502 and 503 and the wiring 504 (see FIG. 25A). The insulating film 505 can be formed using a silicon oxide-based material, a silicon nitride-based material, or the like with plasma-enhanced CVD, sputtering, or the like. Alternatively, the insulating film 505 can be formed by high-density plasma treatment. Here, high-density plasma treatment refers to plasma treatment where plasma density is higher than or equal to $1\times10^{11}$ cm$^{-3}$, preferably, higher than or equal to $1\times10^{11}$ cm$^{-3}$ and lower than or equal to $9\times10^{15}$ cm$^{-3}$ and a high-frequency wave such as a microwave (e.g., a frequency of 2.45 GHz) is used. When plasma is generated under such a condition, low electron temperature is higher than or equal to 0.2 eV and lower than or equal to 2.0 eV. Since such high-density plasma at low electron temperature has low kinetic energy of active species, it is possible to form a film with little plasma damage and fewer defects. In the insulating film formed by the high-density plasma treatment in this manner, the state of an interface between the insulating film and a layer which is in contact with the insulating film is improved. Thus, when the insulating film 505 is formed by high-density plasma treatment, the state of an interface between the insulating film 505 and the semiconductor layer can be improved. Accordingly, electrical properties of a semiconductor element can be improved.

Figure 19:
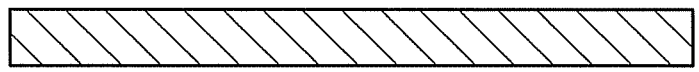
FIG. 19 is a top view according to one embodiment of the present invention.

The first semiconductor layers 506 and 507 are formed over the insulating film 505 (see FIG. 19 and FIG. 25A). The first semiconductor layer 506 is formed so as to overlap with the gate electrode 502 with the insulating film 505 therebetween. The first semiconductor layer 507 is formed so as to overlap with the gate electrode 503 with the insulating film 505 therebetween. The first semiconductor layers 506 and 507 can be formed using a non-crystalline semiconductor layer formed using amorphous silicon (a-Si:H) or the like, microcrystalline silicon (μ-Si:H), polycrystalline silicon, single crystal silicon, a compound semiconductor such as gallium arsenide (GaAs), or an oxide semiconductor such as zinc oxide (ZnO) or an In—Ga—Zn—O-based oxide semiconductor with photolithography, an ink-jet method, a printing method, or the like. Note that the first semiconductor layers 506 and 507 have portions functioning as channel regions of the transistors.

In the case where amorphous silicon (a-Si:H) or microcrystalline silicon is used for the first semiconductor layers 506 and 507, there are advantages that the characteristics of the transistors are uniform and that manufacturing cost is low. In particular, the use of amorphous silicon (a-Si:H) or microcrystalline silicon is effective in forming transistors over a large substrate whose diagonal length exceeds 500 mm.

In the case where polycrystalline silicon is used for the first semiconductor layers 506 and 507, there are advantages that the transistors have high mobility and that manufacturing cost is low. Further, since deterioration in characteristics over time is little, a highly reliable device can be obtained.

In the case where an oxide semiconductor is used for the first semiconductor layers 506 and 507, field effect mobility can be higher than that of a thin film transistor including amorphous silicon. An oxide semiconductor film can be formed with sputtering or the like at a temperature of 300° C. or lower, and a manufacturing process thereof is simpler than that of a thin film transistor including polycrystalline silicon.

Note that as an example of an oxide semiconductor which can be used in this specification, there is an oxide semiconductor represented by $InMO_3(ZnO)_m$ (m>0). Here, M is one or more metal elements selected from gallium (Ga), iron (Fe), nickel (Ni), manganese (Mn), or cobalt (Co). For example, the case where Ga is selected as M includes not only the case where only Ga is used but also the case where Ga and the above metal element other than Ga, such as Ni or Fe, are selected. Further, in the oxide semiconductor, in some cases, a transitional metal element such as Fe or Ni or an oxide of the transitional metal is contained as an impurity element in addition to the metal element contained as M. In this specification, among the oxide semiconductors, an oxide semiconductor containing at least gallium as M is referred to as an In—Ga—Zn—O-based oxide semiconductor, and a thin film formed using the material is referred to as an In—Ga—Zn—O-based non-single-crystal film in some cases.

Second semiconductor layers 508 and 509 are formed over the first semiconductor layer 506, and second semiconductor layers 510 and 511 are formed over the first semiconductor layer 507 (see FIG. 25A). The second semiconductor layer 508 has a portion functioning as one of a source and a drain. The second semiconductor layer 509 has a portion functioning as the other of the source and the drain. The second semiconductor layer 510 has a portion functioning as one of a source and a drain. The second semiconductor layer 511 has a portion functioning as the other of the source and the drain. Note that for the second semiconductor layers, silicon containing phosphorus or the like, a semiconductor material having higher conductivity than the first semiconductor layer, an oxide semiconductor having higher carrier concentration than the first semiconductor layer, or the like can be used. The second semiconductor layers can be each referred to as a buffer layer or an n$^+$ layer depending on its function.

Figure 20:
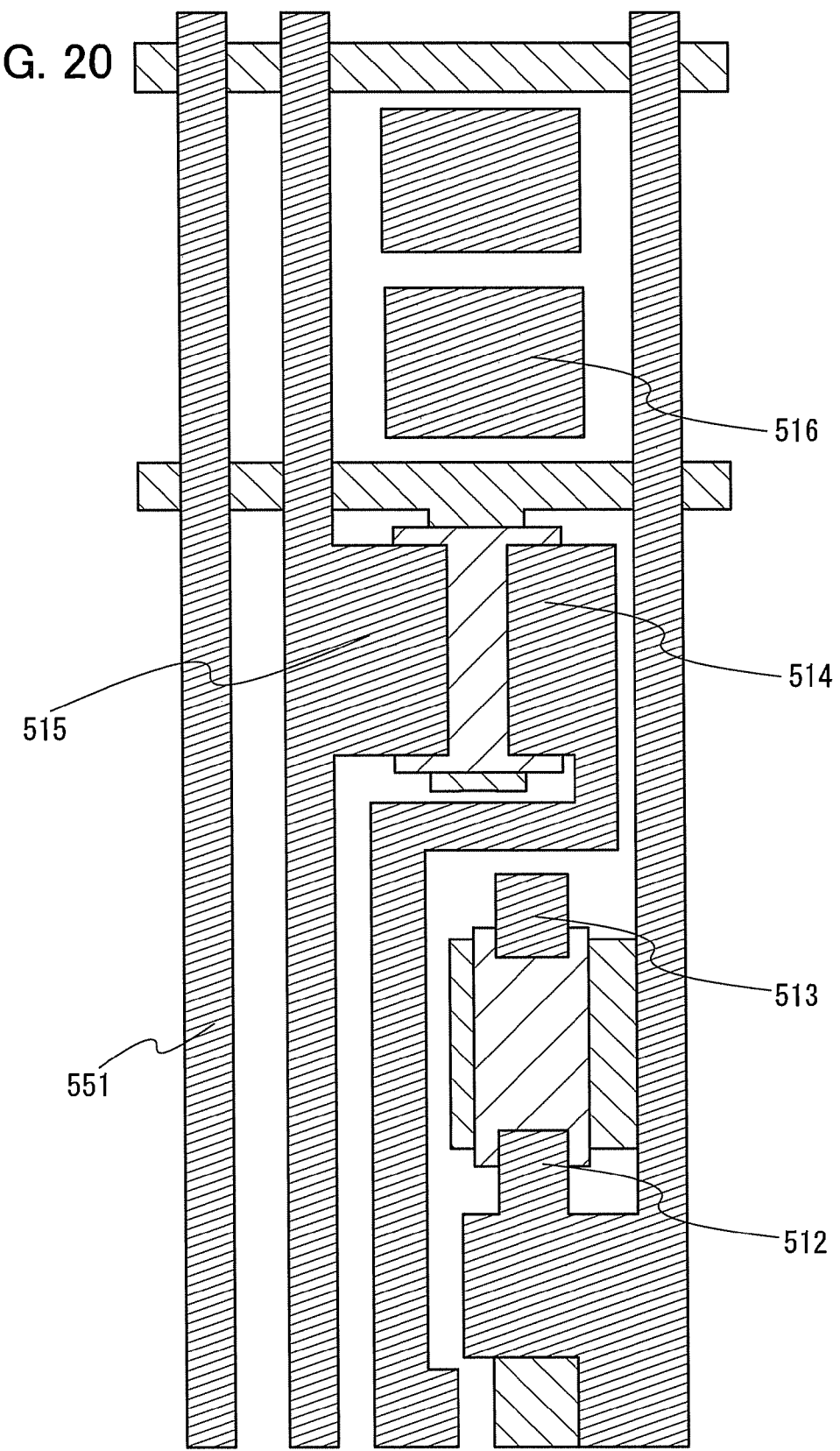
FIG. 20 is a top view according to one embodiment of the present invention.
Figure 21:
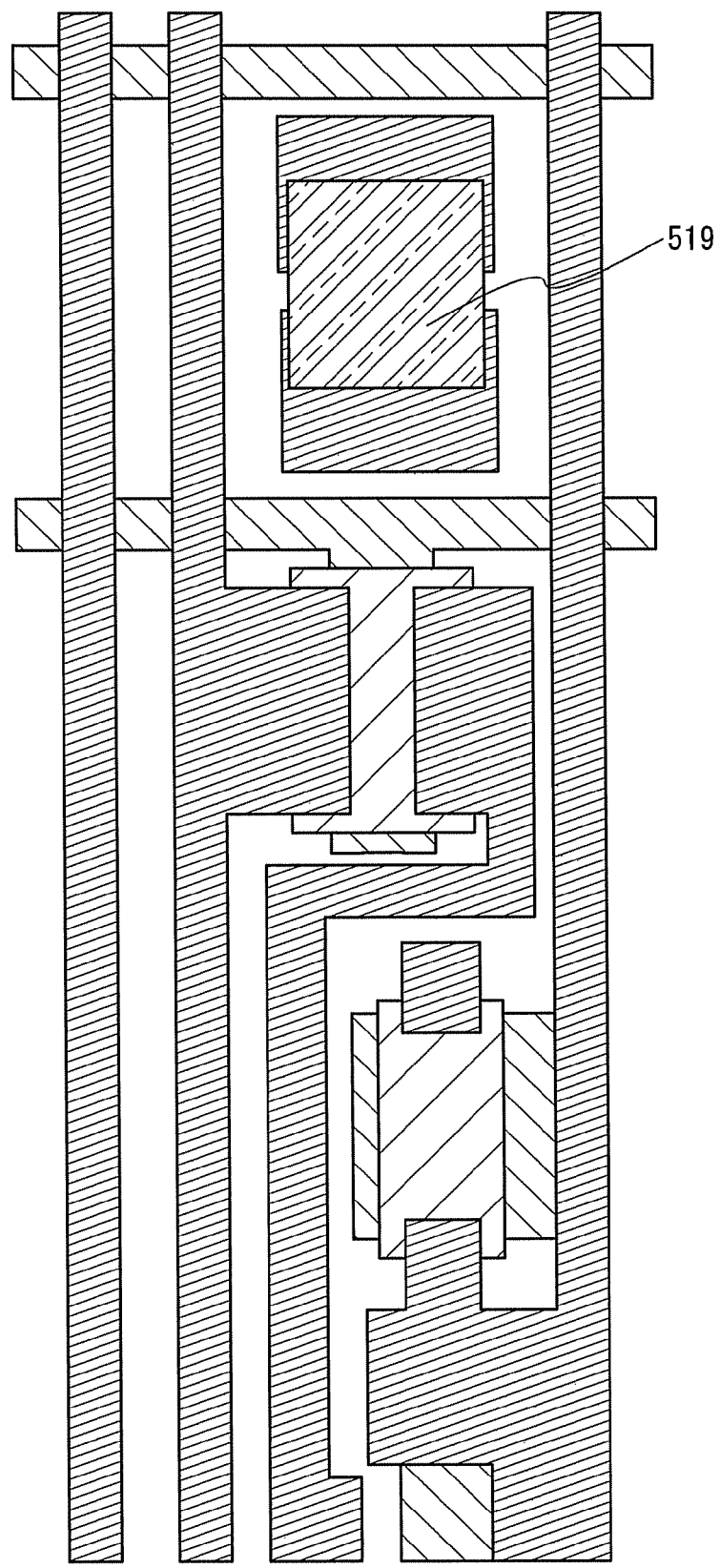
FIG. 21 is a top view according to one embodiment of the present invention.
Figure 25B:
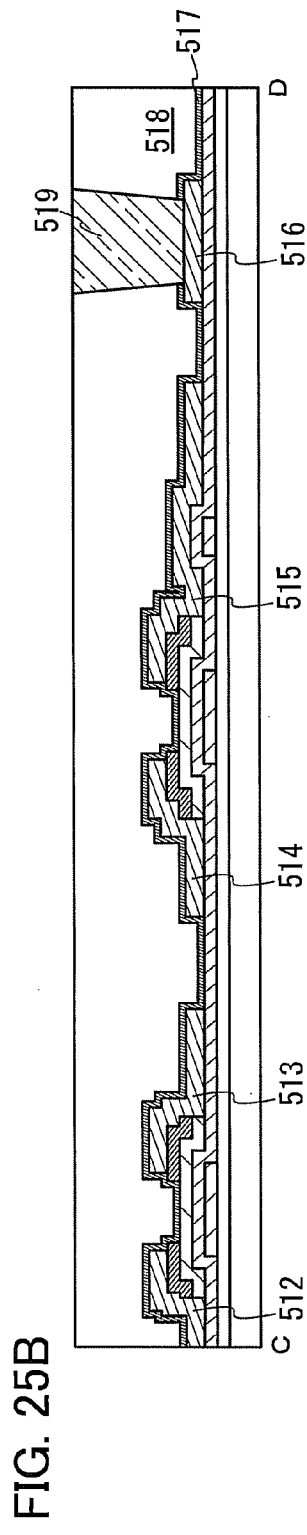

The conductive layers 512, 513, 514, and 515 and the lower electrode 516 of a microstructure (MEMS) are formed over the insulating film 505 and the second semiconductor layers 508, 509, 510, and 511 (see FIG. 20 and FIG. 25B). The conductive layer 512 has a portion functioning as one of a source and a drain. The conductive layer 513 has a portion functioning as the other of the source and the drain. The conductive layer 514 has a portion functioning as one of a source and a drain. The conductive layer 515 has a portion functioning as the other of the source and the drain. The conductive layers 512, 513, 514, and 515 and the lower electrode 516 can be formed using a conductive metal or a semiconductor material, such as titanium, molybdenum, tantalum, chromium, tungsten, aluminum, neodymium, copper, silver, gold, platinum, niobium, silicon, zinc, iron, barium, or germanium; or an alloy material thereof with sputtering, CVD, or the like. Note that in FIG. 20, reference numeral 551 denotes a column line (a line for detecting an x coordinate). The column line 551 is formed using the same material as the conductive layers 512, 513, 514, and 515 and the lower electrode 516.

A passivation film 517 is formed over the conductive layers 512, 513, 514, and 515 and the lower electrode 516 (see FIG. 25B). Silicon nitride or the like can be used for the passivation film 517.

An insulating layer 518 is formed over the passivation film 517 (see FIG. 25B). The insulating layer 518 is formed using a silicon oxide-based material film or a silicon nitride-based material film. In addition, for the insulating layer 518, an organic resin such as polyimide, polyamide, acrylic (including photosensitive acrylic), or benzocyclobutene (BCB) can be used. Further, the insulating layer 518 may have either a single-layer structure or a layered structure.

By etching the insulating layer 518, the conductive layer 513 and the lower electrode 516 are exposed so that contact holes are formed. Next, the filler layer 519 is formed so as to fill the contact hole formed (see FIG. 21 and FIG. 25B). A deformable porous material or an elastic insulating material can be used for the filler layer 519, and any of the materials described in Embodiment 6 can be used.

Figure 25C:
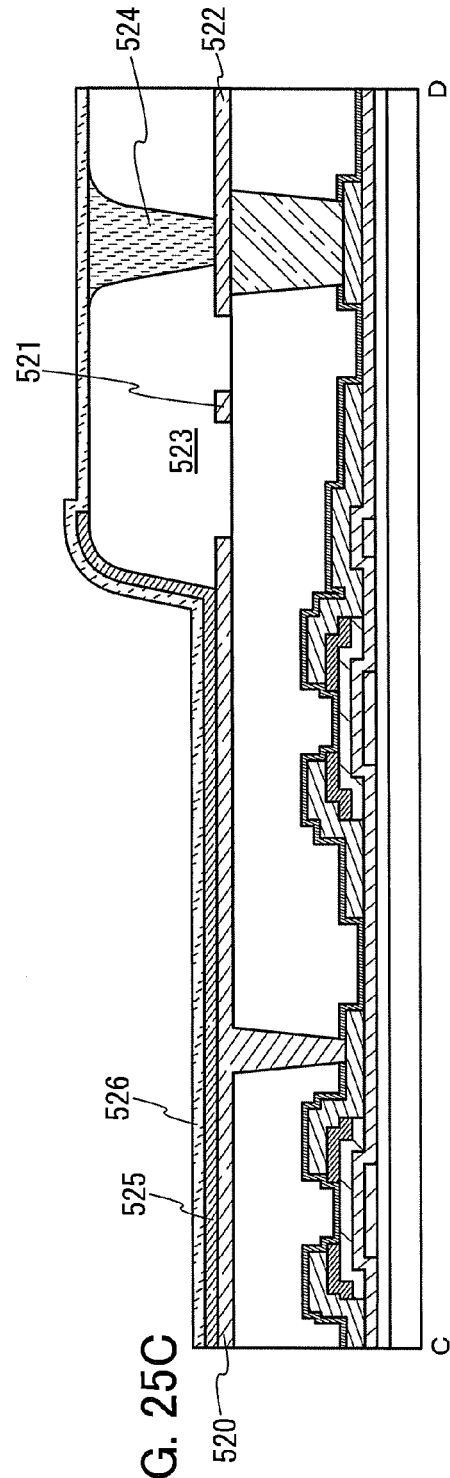
Figure 26:
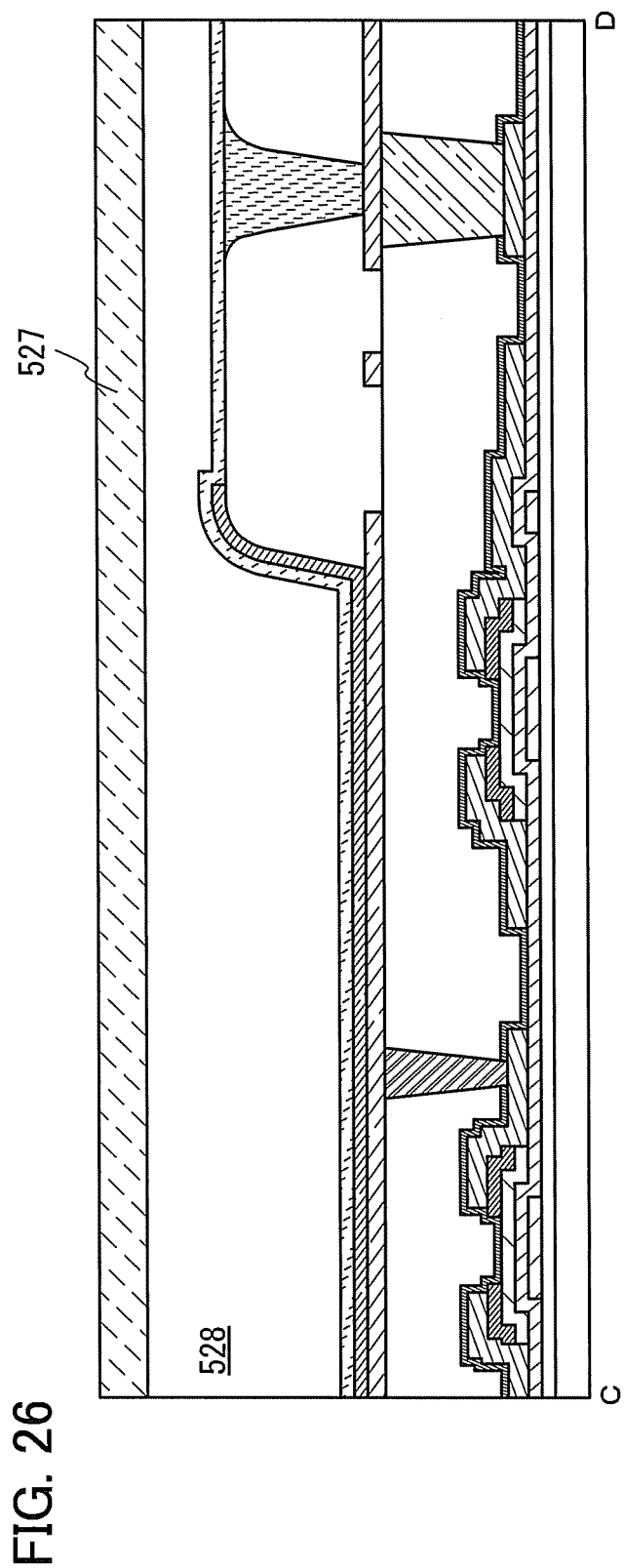
FIG. 26 is a cross-sectional view according to one embodiment of the present invention.

A conductive layer is formed over the insulating layer 518 and the filler layer 519 and is etched to have a desired shape, so that the first electrode 520, the wiring 521, and the upper electrode 522 of the microstructure (MEMS) are formed (see FIG. 22 and FIG. 25C). The upper electrode 522 is formed so as to overlap with the lower electrode with the filler layer 519 therebetween. The first electrode 520, the wiring 521, and the upper electrode 522 can be formed using a conductive metal or a semiconductor material, such as titanium, molybdenum, tantalum, chromium, tungsten, aluminum, neodymium, copper, silver, gold, platinum, niobium, silicon, zinc, iron, barium, or germanium; or an alloy material thereof with sputtering, CVD, or the like.

A partition wall 523 which covers an end portion of the first electrode 520 and has an opening reaching the upper electrode 522 is formed (see FIG. 25C). For the partition wall 523, an organic resin film, an inorganic resin film, or an organic polysiloxane can be used. Specifically, the partition wall 523 is preferably formed using polyimide, polyamide, polyimide amide, acrylic, or a benzocyclobutene-based resin. It is particularly preferable that the partition wall 523 be formed using a photosensitive material to have an opening over the first electrode 520 and the upper electrode 522 so that a sidewall of the opening is formed as a tilted surface with continuous curvature.

A spacer 524 is formed so as to fill the opening in the partition wall 523 reaching the upper electrode 522 (see FIG. 25C). An ultraviolet curable resin or the like can be used for the spacer 524. Specifically, the spacer 524 may be formed using an ultraviolet curable acrylic resin or the like. Note that the spacer 524 is formed so as to overlap with the lower electrode 516.

Here, among the materials used for the filler layer 519, the partition wall 523, and the spacer 524, the material used for the spacer 524 is the hardest material and the material used for the filler layer 519 is the softest material. Elastic modulus or the like indicates hardness or softness. The elastic modulus is a physical value indicating an object's tendency to be deformed elastically. In the case where hardness or softness is indicated by elastic modulus, the elastic modulus of the material used for the spacer 524 is higher than the elastic modulus of the material used for the partition wall 523, and the elastic modulus of the material used for the partition wall 523 is higher than the elastic modulus of the material used for the filler layer 519.

An EL layer 525 is formed over the first electrode 520 (see FIG. 25C). The EL layer 525 includes a hole injection layer, a hole transport layer, a light-emitting layer, an electron transport layer, an electron injection layer, a hole blocking layer, and the like. The material used for the EL layer 525 may be selected as appropriate.

A second electrode 526 is formed over the EL layer 525 and the partition wall 523 (see FIG. 25C). The first electrode 520, the EL layer 525, and the second electrode 526 are included in a light-emitting element. The second electrode 526 can be formed using a light-transmitting conductive material. As the light-transmitting conductive material, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, or the like can be used. The film formed using the light-transmitting conductive material may be formed with sputtering, CVD, or the like; however, this embodiment is not limited to a particular method. Further, the second electrode 526 may have either a single-layer structure or a layered structure.

Through the above steps, an element substrate can be formed. Then, sealing is performed in such a manner that a sealant (not illustrated) is provided at an end portion of the element substrate and the element substrate and a sealing substrate 527 are attached to each other with the sealant (see FIG. 26). The touch panel which is one embodiment of the present invention has a structure where a light-emitting element is provided in a space 528 surrounded by the element substrate, the sealing substrate 527, and the sealant. The space 528 is filled with an inert gas (e.g., nitrogen or argon). The space 528 may be filled with a sealant as a substitute for the inert gas.

Note that an epoxy-based resin is preferably used for the sealant. In addition, it is preferable to use a material which does not transmit moisture or oxygen as much as possible. Further, as the sealing substrate 527, a glass substrate, a plastic substrate formed using fiberglass-reinforced plastics (FRP), polyvinyl fluoride (PVF), polyester, acrylic, or the like can be used.

Figure 27:
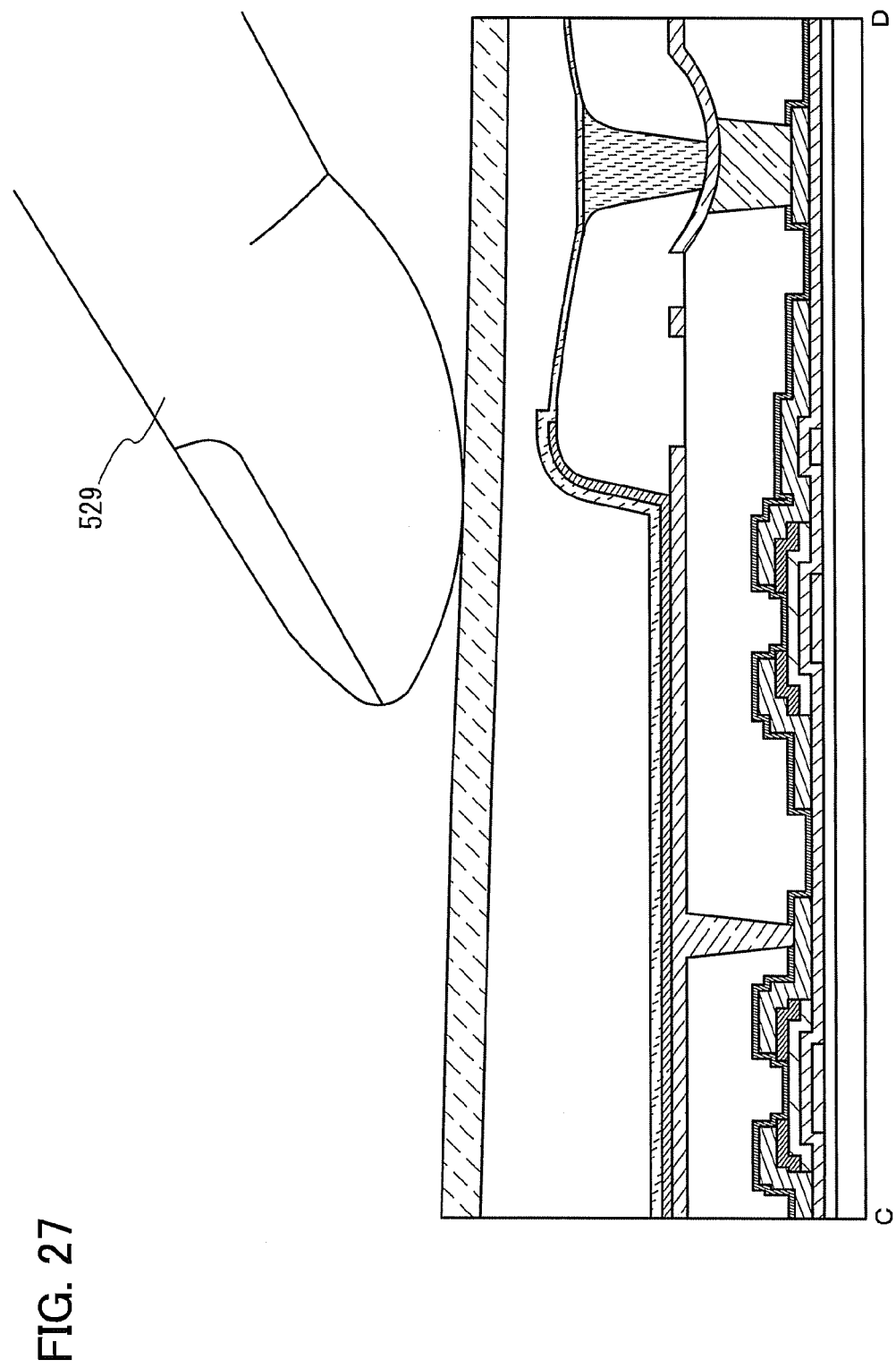
FIG. 27 is a cross-sectional view according to one embodiment of the present invention.

Next, FIG. 27 illustrates the case where the touch panel is touched with a finger.

As illustrated in FIG. 27, when the sealing substrate 527 is touched with a finger 529, the sealing substrate 527 bends. In this case, an upper portion of the partition wall 523 is pressed and dented, and the spacer 524 which is harder (which has higher elastic modulus) than the material used for the partition wall 523 is pressed down. Since the filler layer 519 provided below the spacer 524 is softer (has lower elastic modulus) than the spacer 524, the spacer 524 is pressed down without deformation. The upper electrode 522 of the microstructure (MEMS) is pressed down when the spacer 524 is pressed down. In the case of the capacitive type touch panel, the distance between the lower electrode 516 and the upper electrode 522 of the microstructure (MEMS) is changed. Thus, data can be input. In the case of the resistive type touch panel, the lower electrode 516 and the upper electrode 522 of the microstructure (MEMS) are in contact with each other. Thus, data can be input.

According to one embodiment of the present invention, a touch sensor can be formed in steps of forming a thin film transistor and a light-emitting element.

According to one embodiment of the present invention, a touch sensor and a light-emitting element are disposed, so that it is possible to provide a thin touch panel with less degradation in image quality as compared to the case where a touch sensor is provided above or below a light-emitting element.

According to one embodiment of the present invention, by using materials having different hardness for a filler layer, a partition wall, and a spacer, it is possible to provide a touch panel where data can be input efficiently and pressure is not applied to a light-emitting element easily. Further, by providing a spacer above a touch sensor, durability and sensitivity of the touch sensor can be improved.

Note that this embodiment can be combined with the structure described in any of the other embodiments in this specification as appropriate.

(Embodiment 9)

A touch panel according to one embodiment of the present invention can be used in a variety of electronic devices. Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, electronic paper, an audio reproducing device, a large game machine such as a pinball machine, and the like. Examples of such electronic devices are illustrated in FIGS. 28A and 28B.

Figure 28A:
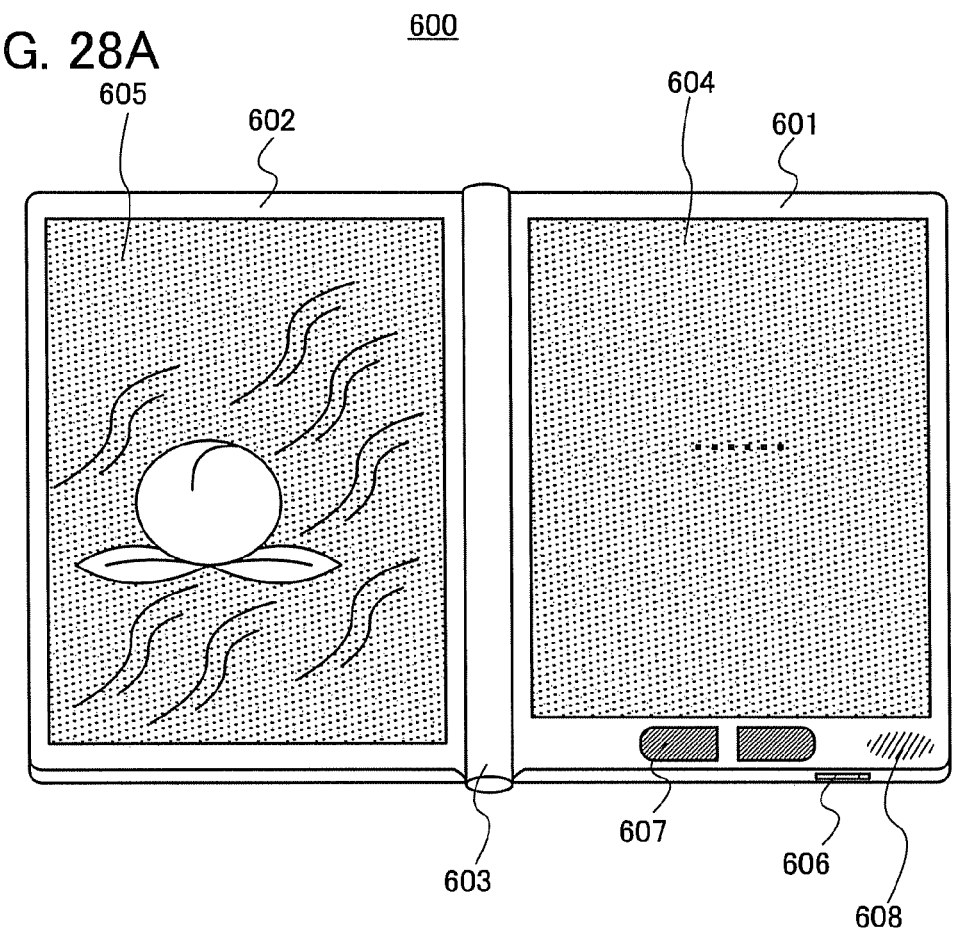
FIGS. 28A and 28B are external views according to one embodiment of the present invention.
Figure 28B:
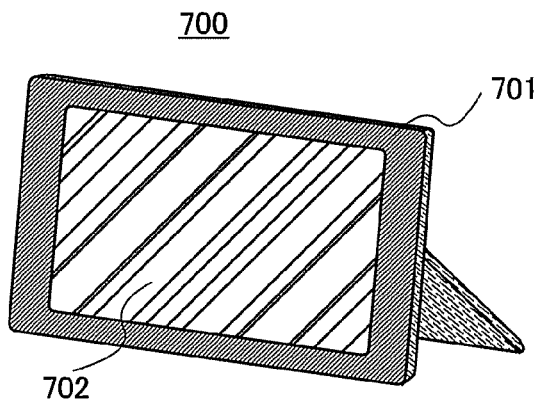

FIG. 28A illustrates an example of an e-book reader 600. For example, the e-book reader 600 includes two housings 601 and 602. The housings 601 and 602 are combined with each other with a hinge 603 so that the e-book reader 600 can be opened and closed with the hinge 603 as an axis. With such a structure, the e-book reader 600 can be operated like a paper book.

A display portion 604 is incorporated in the housing 601, and a display portion 605 is incorporated in the housing 602. Each of the display portions 604 and 605 includes a touch sensor which is one embodiment of the present invention. The display portions 604 and 605 may display one image or different images. In the case where the display portion 604 and 605 display different images, for example, a display portion on the right side (the display portion 604 in FIG. 28A) can display text and a display portion on the left side (the display portion 605 in FIG. 28A) can display images.

FIG. 28A illustrates an example in which the housing 601 includes an operation portion and the like. For example, the housing 601 includes a power source 606, operation keys 607, a speaker 608, and the like. Note that a keyboard, a pointing device, or the like may be provided on a surface of the housing, on which the display portion is provided. Further, an external connection terminal (e.g., an earphone terminal, a USB terminal, or a terminal which can be connected to a variety of cables such as USB cables), a recording medium insertion portion, or the like may be provided on a back surface or a side surface of the housing. Furthermore, the e-book reader 600 may function as an electronic dictionary.

Further, the e-book reader 600 may transmit and receive data wirelessly. Through wireless communication, desired book data or the like can be purchased and downloaded from an electronic book server.

According to one embodiment of the present invention, it is possible to provide a thin e-book reader with less degradation in image quality as compared to the case where a touch sensor is provided above or below a light-emitting element.

Further, according to one embodiment of the present invention, by using materials having different hardness for a filler layer, a partition wall, and a spacer, it is possible to provide a touch panel where data can be input efficiently and pressure is not applied to a light-emitting element easily. Furthermore, by providing a spacer above a touch sensor, it is possible to provide an e-book reader which includes a touch sensor having high durability and high sensitivity.

FIG. 28B illustrates an example of a digital photo frame 700. For example, in the digital photo frame 700, a display portion 702 is incorporated in a housing 701. The display portion 702 can display a variety of images. For example, the display portion 702 can display data related to images photographed by a digital camera or the like, so that the digital photo frame 700 can function as a normal photo frame.

By employing the touch sensor which is one embodiment of the present invention, it is possible to provide a thin digital photo frame with less degradation in image quality as compared to the case where a touch sensor is provided above or below a light-emitting element.

Further, according to one embodiment of the present invention, by using materials having different hardness for a filler layer, a partition wall, and a spacer, it is possible to provide a touch panel where data can be input efficiently and pressure is not applied to a light-emitting element easily. Furthermore, by providing a spacer above a touch sensor, it is possible to provide a digital photo frame which includes a touch sensor having high durability and high sensitivity.

This application is based on Japanese Patent Application serial no. 2009-128549 filed with Japan Patent Office on May 28, 2009, the entire contents of which are hereby incorporated by reference.

What is claimed is:

1. A touch panel comprising:
a microstructure over a first substrate, the microstructure comprising a lower electrode, an upper electrode over the lower electrode and a filler layer between the lower electrode and the upper electrode;
a thin film transistor over the first substrate, the thin film transistor comprising a gate electrode and a semiconductor layer;
a conductive layer over the first substrate, the conductive layer being in contact with the semiconductor layer;
an insulating layer over the thin film transistor;
a light-emitting element over the first substrate, the light-emitting element comprising a first electrode electrically connected to the conductive layer and over the insulating layer, a light-emitting layer over the first electrode and a second electrode over the light-emitting layer;
a partition wall for covering an end portion of the first electrode and the microstructure, the partition wall having an opening overlapping with the filler layer; and
a spacer over the upper electrode, the spacer overlapping with the filler layer,
wherein the spacer is provided so as to fill the opening in the partition wall,
wherein the microstructure does not overlap with the light-emitting layer,
wherein the first electrode of the light-emitting element and the upper electrode of the microstructure are spaced from each other,
wherein the lower electrode is formed using the same material as the gate electrode, and
wherein the upper electrode is formed using the same material as the first electrode.

2. The touch panel according to claim 1, further comprising a second substrate over the first substrate with the microstructure, the thin film transistor, the conductive layer, the light-emitting element and the spacer between the first substrate and the second substrate,
wherein the microstructure is configured to sense a pressure on the second substrate by movement of the upper electrode in a direction to the lower electrode.

3. The touch panel according to claim 1, wherein the filler layer is formed using a porous insulating material which can be reversibly deformed by a pressure.

4. The touch panel according to claim 3, wherein the porous insulating material is a block copolymer.

5. The touch panel according to claim 3, wherein porosity of the filler layer is higher than or equal to 20% and lower than or equal to 80%.

6. The touch panel according to claim 1, wherein the filler layer is formed using an elastic insulating material which can be reversibly deformed by a pressure.

7. The touch panel according to claim 6, wherein the elastic insulating material is one of an elastomer and a thermoplastic elastomer.

8. The touch panel according to claim 1,
wherein the spacer is formed using a material which is harder than a material of the partition wall, and
wherein the partition wall is formed using a material which is harder than the material of the filler layer.

9. The touch panel according to claim 1,
wherein the spacer is formed using a material having higher elastic modulus than the material of the partition wall, and
wherein the partition wall is formed using a material having higher elastic modulus than the material of the filler layer.

10. The touch panel according to claim 1, wherein the thin film transistor is a bottom-gate transistor.

11. The touch panel according to claim 1, wherein the semiconductor layer comprises an oxide semiconductor.

12. The touch panel according to claim 11, wherein the oxide semiconductor comprises In, Ga, Zn and O.

13. A touch panel comprising:
a microstructure over a first substrate, the microstructure comprising a lower electrode, an upper electrode over the lower electrode and a filler layer between the lower electrode and the upper electrode;
a thin film transistor over the first substrate, the thin film transistor comprising a gate electrode and a semiconductor layer;
a conductive layer over the first substrate, the conductive layer being in contact with the semiconductor layer;
an insulating layer over the thin film transistor;
a light-emitting element over the first substrate, the light-emitting element comprising a first electrode electrically connected to the conductive layer and over the insulating layer, a light-emitting layer over the first electrode and a second electrode over the light-emitting layer;
a partition wall for covering an end portion of the first electrode and the microstructure, the partition wall having an opening overlapping with the filler layer; and
a spacer over the upper electrode, the spacer overlapping with the filler layer,
wherein the spacer is provided so as to fill the opening in the partition wall,
wherein the microstructure does not overlap with the light-emitting layer,
wherein the first electrode of the light-emitting element and the upper electrode of the microstructure are spaced from each other,
wherein the lower electrode is formed using the same material as the conductive layer, and
wherein the upper electrode is formed using the same material as the first electrode.

14. The touch panel according to claim 13, further comprising a second substrate over the first substrate with the microstructure, the thin film transistor, the conductive layer, the light-emitting element and the spacer between the first substrate and the second substrate,
wherein the microstructure is configured to sense a pressure on the second substrate by movement of the upper electrode in a direction to the lower electrode.

15. The touch panel according to claim 13, wherein the filler layer is formed using a porous insulating material which can be reversibly deformed by a pressure.

16. The touch panel according to claim 15, wherein the porous insulating material is a block copolymer.

17. The touch panel according to claim 15, wherein porosity of the filler layer is higher than or equal to 20% and lower than or equal to 80%.

18. The touch panel according to claim 13, wherein the filler layer is formed using an elastic insulating material which can be reversibly deformed by a pressure.

19. The touch panel according to claim 18, wherein the elastic insulating material is one of an elastomer and a thermoplastic elastomer.

20. The touch panel according to claim 13,
wherein the spacer is formed using a material which is harder than a material of the partition wall, and
wherein the partition wall is formed using a material which is harder than the material of the filler layer.

21. The touch panel according to claim 13,
wherein the spacer is formed using a material having higher elastic modulus than the material of the partition wall, and
wherein the partition wall is formed using a material having higher elastic modulus than the material of the filler layer.

22. The touch panel according to claim 13, wherein the thin film transistor is a bottom-gate transistor.

23. The touch panel according to claim 13, wherein the semiconductor layer comprises an oxide semiconductor.

24. The touch panel according to claim 23, wherein the oxide semiconductor comprises In, Ga, Zn and O.

25. A method for manufacturing a touch panel, the method comprising the steps of:
forming a gate electrode over a substrate;
forming an insulating film over the gate electrode;
forming a semiconductor layer over the insulating film;
forming a first conductive layer and a lower electrode over the insulating film, wherein a part of the first conductive layer overlaps the semiconductor layer;
forming an insulating layer over the first conductive layer and the lower electrode;
forming an hole in the insulating layer, wherein the hole overlaps the lower electrode;
forming a filler layer in the hole;
forming a first electrode and an upper electrode spaced from each other, wherein the first electrode is electrically connected to the semiconductor layer and a part of the upper electrode overlaps the filler layer;
forming a partition wall for covering an end portion of the first electrode and the upper electrode over the insulating layer;
forming an opening in the partition wall, the opening overlapping with the filler layer;
forming a spacer so as to fill the opening, wherein the spacer overlaps the filler layer;
forming a light-emitting layer over the first electrode; and
forming a second electrode over the light-emitting layer,
wherein the lower electrode, the filler layer, the upper electrode and the spacer do not overlap with the light-emitting layer.

* * * * *